(12) United States Patent
Hisamatsu et al.

(10) Patent No.: US 10,841,524 B2
(45) Date of Patent: Nov. 17, 2020

(54) IMAGING ELEMENT AND METHOD FOR CONTROLLING IMAGING ELEMENT, IMAGING APPARATUS, AND ELECTRONIC APPARATUS

(71) Applicant: SONY SEMICONDUCTOR SOLUTIONS CORPORATION, Kanagawa (JP)

(72) Inventors: Yasuaki Hisamatsu, Kanagawa (JP); Kazutaka Takaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/465,269

(22) PCT Filed: Dec. 14, 2017

(86) PCT No.: PCT/JP2017/044849
§ 371 (c)(1),
(2) Date: May 30, 2019

(87) PCT Pub. No.: WO2018/123609
PCT Pub. Date: Jul. 5, 2018

(65) Prior Publication Data
US 2019/0394417 A1  Dec. 26, 2019

(30) Foreign Application Priority Data
Dec. 27, 2016  (JP) .................................. 2016-253077

(51) Int. Cl.
*H04N 5/378* (2011.01)
*H03M 7/16* (2006.01)
(Continued)

(52) U.S. Cl.
CPC ........... *H04N 5/378* (2013.01); *H03C 3/0966* (2013.01); *H03M 1/0872* (2013.01);
(Continued)

(58) Field of Classification Search
CPC .. H04N 5/3575; H04N 5/37455; H04N 5/378; H03M 1/0872; H03M 1/12;
(Continued)

(56) References Cited

U.S. PATENT DOCUMENTS

| 2015/0181145 A1* | 6/2015 | Lee ...................... H04N 5/3745 250/208.1 |
| 2015/0189214 A1* | 7/2015 | Kurose ................... H01L 25/18 250/208.1 |
| 2018/0041218 A1* | 2/2018 | Sato ........................ H03M 1/56 |

FOREIGN PATENT DOCUMENTS

| JP | 2011-234326 A | 11/2011 |
| JP | 2015-126043 A | 7/2015 |
| WO | 2016/136500 A1 | 9/2016 |

OTHER PUBLICATIONS

International Search Report and Written Opinion of PCT Application No. PCT/JP2017/044E349, dated Jan. 30, 2018, 08 pages of ISRWO.

\* cited by examiner

*Primary Examiner* — Lin Ye
*Assistant Examiner* — Chriss S Yoder, III
(74) *Attorney, Agent, or Firm* — Chip Law Group

(57) ABSTRACT

The present disclosure relates to an imaging element and a method for controlling an imaging element, an imaging apparatus, and an electronic apparatus that can reduce the size of the imaging element and can reduce power consumption. First, a gray code corresponding to a P-phase pixel signal of each pixel is converted into a binary code. Then, a difference between a binary code corresponding to the (Continued)

converted same bit and a binary code of the pixel signal in which all bits are 0 and which is latched in a temporary latch is continuously calculated and is latched as the binary code of the P-phase pixel signal in the temporary latch. Then, a gray code corresponding to a D-phase pixel signal of each pixel is converted into a binary code. Then, a difference between a binary code corresponding to the converted same bit and the binary code of P-phase the pixel signal which is latched in the temporary latch is continuously calculated. The present disclosure can be applied to an imaging apparatus.

11 Claims, 21 Drawing Sheets

(51) Int. Cl.
  *H03C 3/09* (2006.01)
  *H03M 1/08* (2006.01)
  *H03M 1/28* (2006.01)
  *H03M 1/56* (2006.01)
  *H03M 1/68* (2006.01)
(52) U.S. Cl.
  CPC ............. *H03M 1/285* (2013.01); *H03M 1/56* (2013.01); *H03M 1/687* (2013.01); *H03M 7/16* (2013.01)
(58) Field of Classification Search
  CPC ........ H03M 1/285; H03M 1/56; H03M 1/687; H03M 7/16; H03C 3/0966; H03K 23/005
  See application file for complete search history.

FIG. 7

```
step1:   P[0] = GC[0] xor 0
step2:   P[1] = GC[1] xor P[0]
step3:   P[2] = GC[2] xor P[1]
step4:   P[3] = GC[3] xor P[2]
step5:   P[4] = GC[4] xor P[3]
step6:   P[5] = GC[5] xor P[4]
step7:   P[6] = GC[6] xor P[5]
step8:   P[7] = GC[7] xor P[6]
step9:   P[8] = GC[8] xor P[7]
step10:  P[9] = GC[9] xor P[8]
```
⎫ PREPROCESSING (DERIVATION OF BINa[0])

```
step11:  BINa[0]  = GC[10] xor P[9]
step12:  BINa[1]  = GC[1]  xor BINa[0]
step13:  BINa[2]  = GC[2]  xor BINa[1]
step14:  BINa[3]  = GC[3]  xor BINa[2]
step15:  BINa[4]  = GC[4]  xor BINa[3]
step16:  BINa[5]  = GC[5]  xor BINa[4]
step17:  BINa[6]  = GC[6]  xor BINa[5]
step18:  BINa[7]  = GC[7]  xor BINa[6]
step19:  BINa[8]  = GC[8]  xor BINa[7]
step20:  BINa[9]  = GC[9]  xor BINa[8]
step21:  BINa[10] = GC[10] xor BINa[9]
```

(C[0], BINs[0])  = BINa[0]  + BINb[0]  + 0
(C[1], BINs[1])  = BINa[1]  + BINb[1]  + C[0]
(C[2], BINs[2])  = BINa[2]  + BINb[2]  + C[1]
(C[3], BINs[3])  = BINa[3]  + BINb[3]  + C[2]
(C[4], BINs[4])  = BINa[4]  + BINb[4]  + C[3]
(C[5], BINs[5])  = BINa[5]  + BINb[5]  + C[4]
(C[6], BINs[6])  = BINa[6]  + BINb[6]  + C[5]
(C[7], BINs[7])  = BINa[7]  + BINb[7]  + C[6]
(C[8], BINs[8])  = BINa[8]  + BINb[8]  + C[7]
(C[9], BINs[9])  = BINa[9]  + BINb[9]  + C[8]
(BINs[11], BINs[10]) = BINa[10] + BINb[10] + C[9]

⎫ CONVERSION AND ADDITION

FIG. 11

| A/D State | GC LATCH | TEMPORARY LATCH | ALU INPUT | | | ALU OUTPUT | IF LATCH | DETAILS OF ALU CALCULATION (REPRESENT CALCULATION OF COMPLEMENT VALUE OF 1 WITH DATA OF COMPLEMENT VALUE OF 2) |
|---|---|---|---|---|---|---|---|---|
| | | | OUTPUT SIDE OF GC LATCH | OUTPUT SIDE OF TEMPORARY LATCH | | | | |
| P-PHASE COUNT | Pval_gc | ↑ | ↑ | ↑ | | ↑ | ↑ | |
| P-PHASE LATCH TRANSMISSION | ↑ | Pval | !Pval_gc | 2'b00(Fix) | | Pval | ↑ | !(!Pval+0)=Pval |
| D-PHASE COUNT | Dval_gc | ↑ | ↑ | ↑ | | ↑ | ↑ | |
| D-PHASE LATCH TRANSMISSION (CDS) | ↑ | ↑ | !Dval_gc | Pval | | Dval−Pval | Dval−Pval | !(!(Dval+Pval)=!((−Dval+1)+Pval) =−(−Dval+1+Pval)+1=Dval−Pval |

IMAGING ELEMENT AND METHOD FOR CONTROLLING IMAGING ELEMENT, IMAGING APPARATUS, AND ELECTRONIC APPARATUS

CROSS REFERENCE TO RELATED APPLICATIONS

This application is a U.S. National Phase of International Patent Application No. PCT/JP2017/044849 filed on Dec. 14, 2017, which claims priority benefit of Japanese Patent Application No. JP 2016-253077 filed in the Japan Patent Office on Dec. 27, 2016. Each of the above-referenced applications is hereby incorporated herein by reference in its entirety.

TECHNICAL FIELD

The present disclosure relates to an imaging element and a method for controlling an imaging element, an imaging apparatus, and an electronic apparatus, and more particularly, to an imaging element and a method for controlling an imaging element, an imaging apparatus, and an electronic apparatus that can reduce the size of the apparatus and power consumption.

BACKGROUND ART

A column counter used in an analog-digital converter (ADC) of an imaging element has a two-stage configuration of a gray code latch (5 bits) and a ripple counter (12 bits) (for example, see Patent Document 1).

CITATION LIST

Patent Document

Patent Document 1: Japanese Patent Application Laid-Open No. 2011-234326

SUMMARY OF THE INVENTION

Problems to be Solved by the Invention

However, since the column counter disclosed in Patent Document 1 has the two-stage configuration of the gray code latch (5 bits) and the ripple counter (12 bits), a mounting area is large and power consumption is also large.

The present disclosure has been made in view of the above-mentioned problems. Particularly, an object of the present disclosure is to provide a technique that reduces a mounting area required for the configuration of a column counter to reduce the size of the configuration of an apparatus and power consumption.

Solutions to Problems

An imaging element according to an aspect of the present disclosure includes: an imaging unit that includes a plurality of pixels and captures an image; a gray code latch that latches a gray code corresponding to a pixel signal of the pixel; a conversion unit that converts the gray code latched in the gray code latch into a binary code; a temporary latch that temporarily latches a predetermined binary code; and a calculation unit that calculates a difference between the binary code converted from the gray code by the conversion unit and the predetermined binary code latched in the temporary latch. After the conversion unit converts the gray code into the binary code, the calculation unit continuously calculates a difference between a binary code corresponding to the same bit converted by the conversion unit and the predetermined binary code latched in the temporary latch.

The conversion unit may calculate the binary code corresponding to a least significant bit first and sequentially convert the gray code corresponding to a high-order bit into the binary code, using the binary code corresponding to the least significant bit.

The conversion unit may calculate an exclusive OR of all bits latched in the gray code latch as the binary code corresponding to the least significant bit.

The conversion unit may convert the gray code latched in the gray code latch into the binary code in units of a plurality of bits. After the conversion unit converts the gray code into the binary code, the calculation unit may continuously calculate a difference between the binary code corresponding to the same bit converted by the conversion unit and the predetermined binary code latched in the temporary latch in the units of the plurality of bits.

The temporary latch may latch a binary code in which all bits are 0 as the predetermined binary code. The calculation unit may calculate a binary code formed by a difference between the binary code converted from the gray code of a P-phase pixel signal which is the pixel signal in a state in which the pixels are initialized and the binary code in which all bits are 0 and which is latched in the temporary latch as a binary code of the P-phase pixel signal and latch the calculated binary code in the temporary latch.

The calculation unit may output a difference between the binary code converted from the gray code of a D-phase pixel signal which is the pixel signal corresponding to an amount of light received by the pixels and the binary code of the P-phase pixel signal latched in the temporary latch as a binary code of a pixel signal subjected to correlated double sampling (CDS).

The conversion unit may convert a complement number of the gray code latched in the gray code latch into a binary code. The calculation unit may calculate a difference between the binary code which is a conversion result of the conversion unit and the predetermined binary code latched in the temporary latch and output a complement number of the difference.

The imaging element may further include a gray code counter that sequentially generates the gray code. The gray code counter may include: a low-order gray code generation unit that generates a gray code lower than a predetermined bit among gray codes corresponding to a predetermined number of bits on the basis of a clock signal; a high-order gray code generation unit that generates a gray code higher than a predetermined bit among the gray codes corresponding to the predetermined number of bits on the basis of the clock signal; and a frequency-divided clock signal generation unit that generates a frequency-divided clock signal obtained by dividing a frequency of the clock signal by a predetermined number on the basis of a gray code corresponding to the low-order bit. The high-order gray code generation unit may generate a gray code higher than a predetermined bit among the gray codes corresponding to the predetermined number of bits on the basis of the frequency-divided clock.

According to another aspect of the present disclosure, there is provided a method for controlling an imaging element including an imaging unit that includes a plurality of pixels and captures an image, a gray code latch that latches a gray code corresponding to a pixel signal of the pixel, a conversion unit that converts the gray code latched in the gray code latch into a binary code, a temporary latch that temporarily latches a predetermined binary code, and a calculation unit that calculates a difference between the binary code converted from the gray code by the conversion unit and the predetermined binary code latched in the temporary latch. The method includes: after the conversion unit converts the gray code into the binary code, allowing the calculation unit to continuously calculate a difference between a binary code corresponding to the same bit converted by the conversion unit and the predetermined binary code latched in the temporary latch.

An imaging apparatus according to still another aspect of the present disclosure includes: an imaging unit that includes a plurality of pixels and captures an image; a gray code latch that latches a gray code corresponding to a pixel signal of the pixel; a conversion unit that converts the gray code latched in the gray code latch into a binary code; a temporary latch that temporarily latches a predetermined binary code; and a calculation unit that calculates a difference between the binary code converted from the gray code by the conversion unit and the predetermined binary code latched in the temporary latch. After the conversion unit converts the gray code into the binary code, the calculation unit continuously calculates a difference between a binary code corresponding to the same bit converted by the conversion unit and the predetermined binary code latched in the temporary latch.

An electronic apparatus according to yet another aspect of the present disclosure includes: an imaging unit that includes a plurality of pixels and captures an image; a gray code latch that latches a gray code corresponding to a pixel signal of the pixel; a conversion unit that converts the gray code latched in the gray code latch into a binary code; a temporary latch that temporarily latches a predetermined binary code; and a calculation unit that calculates a difference between the binary code converted from the gray code by the conversion unit and the predetermined binary code latched in the temporary latch. After the conversion unit converts the gray code into the binary code, the calculation unit continuously calculates a difference between a binary code corresponding to the same bit converted by the conversion unit and the predetermined binary code latched in the temporary latch.

According an aspect of the present disclosure, an imaging unit including a plurality of pixels captures an image. A gray code latch latches a gray code corresponding to a pixel signal of the pixel. A conversion unit converts the gray code latched in the gray code latch into a binary code. A temporary latch temporarily latches a predetermined binary code. A calculation unit calculates a difference between the binary code converted from the gray code by the conversion unit and the predetermined binary code latched in the temporary latch. After the conversion unit converts the gray code into the binary code, the calculation unit continuously calculates a difference between a binary code corresponding to the same bit converted by the conversion unit and the predetermined binary code latched in the temporary latch.

Effects of the Invention

According to an aspect of the present disclosure, it is possible to reduce a mounting area to reduce the size of the configuration of an apparatus. In addition, it is possible to reduce power consumption.

BRIEF DESCRIPTION OF DRAWINGS

FIG. 7 is a diagram illustrating an example of a process of an ALU in the column counter according to the present disclosure.

FIG. 11 is a diagram illustrating an operation of the ALU illustrated in FIG. 10.

MODE FOR CARRYING OUT THE INVENTION

Figure 1:
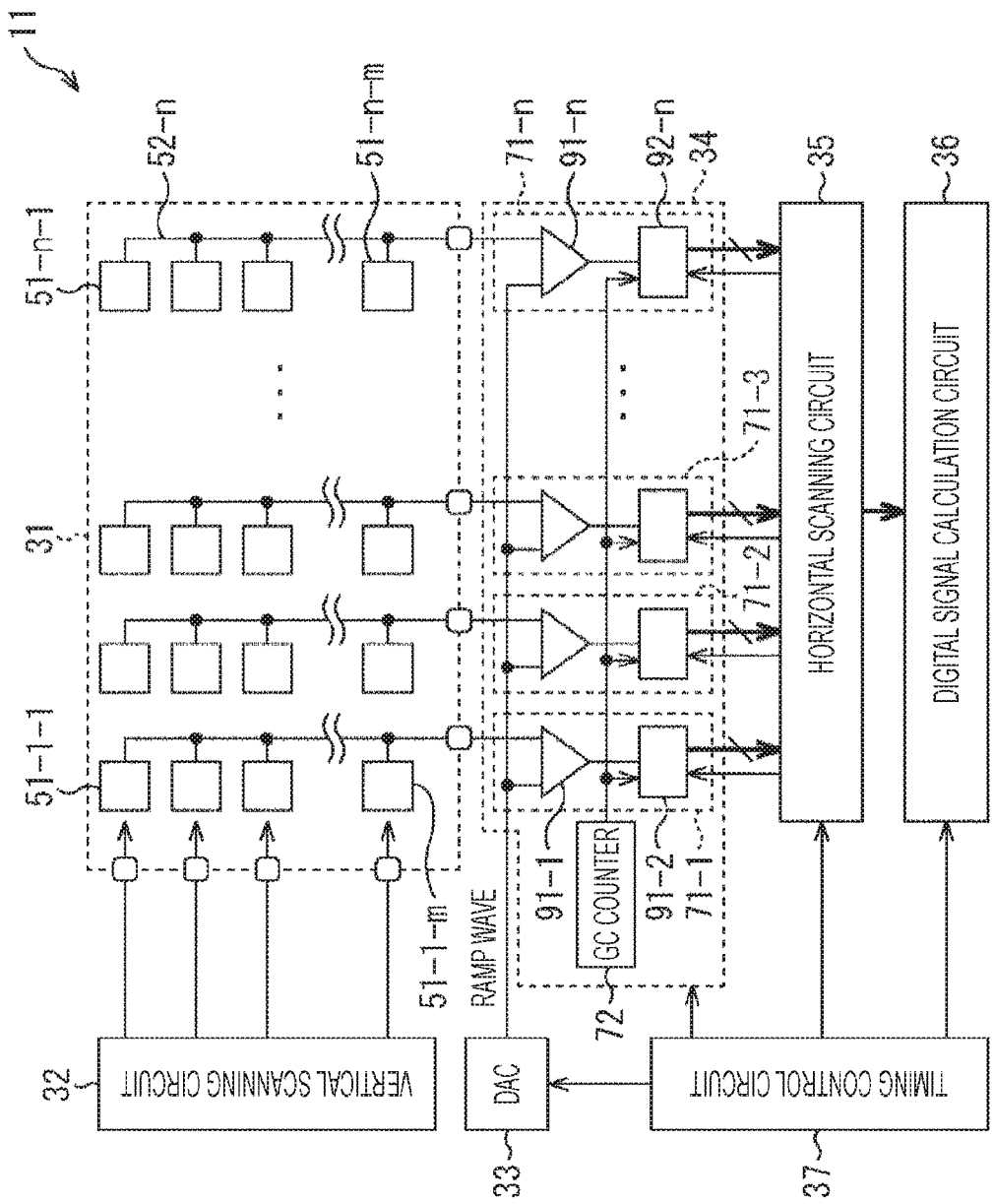
FIG. 1 is a diagram illustrating an example of the configuration of an imaging element according to the present disclosure.

Hereinafter, preferred embodiments of the present disclosure will be described in detail with reference to the accompanying drawings. In addition, in the specification and the drawings, components having substantially the same functional configurations are denoted by the same reference numerals and the description thereof will not be repeated.

<Example of Configuration of Imaging Element>

An example of the configuration of an imaging element to which technology according to the present disclosure is applied will be described.

FIG. 1 illustrates an example of the configuration of the imaging element according to the present disclosure. An imaging element 11 according to the present disclosure includes a pixel array 31, a vertical scanning circuit 32, a digital-analog converter (DAC) 33, an analog-digital converter (ADC) 34, a horizontal scanning circuit 35, a digital signal calculation circuit 36, and a timing control circuit 37.

The pixel array 31 includes pixels 51-1-1 to 51-$n$-$m$ which are arranged in an array. Each of the pixels 51-1-1 to 51-$n$-$m$ generates charge corresponding to the amount of light received by the pixel and outputs a pixel signal corresponding to the generated charge. Note that, hereinafter, in a case where the pixels 51-1-1 to 51-$n$-$m$ do not need to be particularly distinguished from each other, the pixels 51-1-1 to 51-$n$-$m$ are simply referred to as pixels 51, which holds for other configurations. In addition, m and n indicate the number of rows and the number of columns, respectively.

The vertical scanning circuit 32 outputs pixel signals from each row of the pixels 51 in the pixel array 31 to the analog-digital converter (ADC) 34 through vertical transmission lines 52-1 to 52-$m$ on the basis of a timing control signal supplied from the timing control circuit 37.

The DAC 33 generates a ramp wave by outputting a voltage which is a digital signal while changing the voltage at a predetermined rate on the basis of a timing control signal supplied from the timing control circuit 37 and supplies the ramp wave to the ADC 34.

The analog-digital converter (ADC) 34 acquires pixel signals which are analog signals supplied from each row of the pixels 51 in the pixel array 31 on the basis of a timing control signal supplied from the timing control circuit 37, sequentially converts the pixel signals into digital signals using the ramp wave supplied from the DAC 33, and supplies the digital signals to the horizontal scanning circuit 35.

Specifically, the ADC 34 includes analog-digital converter (ADC) circuits 71-1 to 71-$n$ which are provided in the vertical transmission lines 52-1 to 52-$n$, respectively, and a gray code (GC) counter 72. In addition, the ADC circuits 71-1 to 71-$n$ include comparators 91-1 to 91-$n$ and column counters 92-1 to 92-$n$, respectively, and convert pixel signals supplied from each pixel 51 through each vertical transmission line 52 from analog signals to digital signals using the ramp wave supplied from the DAC 33 and a gray code supplied from the GC counter 72.

The comparator 91 compares the pixel signal supplied from the vertical transmission line 52 with the ramp wave supplied from the DAC 33. In a case where the ramp wave is greater than the pixel signal, the comparator 91 supplies a comparison result indicating the fact to the column counter 92.

The column counter 92 latches the gray code that is supplied from the gray code (GC) counter 72 and is changed at a rate corresponding to the rate at which the ramp wave from the DAC 33 is changed at the time when the comparison result is supplied from the comparator 91 and outputs the gray code to the horizontal scanning circuit 35.

The horizontal scanning circuit 35 horizontally scans the pixel signals converted into the digital signals, the digital signals being supplied from the ADC 34, in row units on the basis of a timing control signal supplied from the timing control circuit 37 and outputs the pixel signals to the digital signal calculation circuit 36.

The digital signal calculation circuit 36 calculates a digital signal with the horizontally scanned pixel signal transmitted from the horizontal scanning circuit 35, on the basis of a timing control signal supplied from the timing control circuit 37, and outputs the calculation result.

The timing control circuit 37 includes a phase locked loop (PLL) 37$a$ (FIG. 2), generates a timing control signal on the basis of an oscillating signal from the PLL 37$a$, and supplies the timing control signal to the vertical scanning circuit 32, the DAC 33, the ADC 34, the horizontal scanning circuit 35, and the digital signal calculation circuit 36.

<Configuration of Counter Latch Illustrated in FIG. 1>

Figure 2:
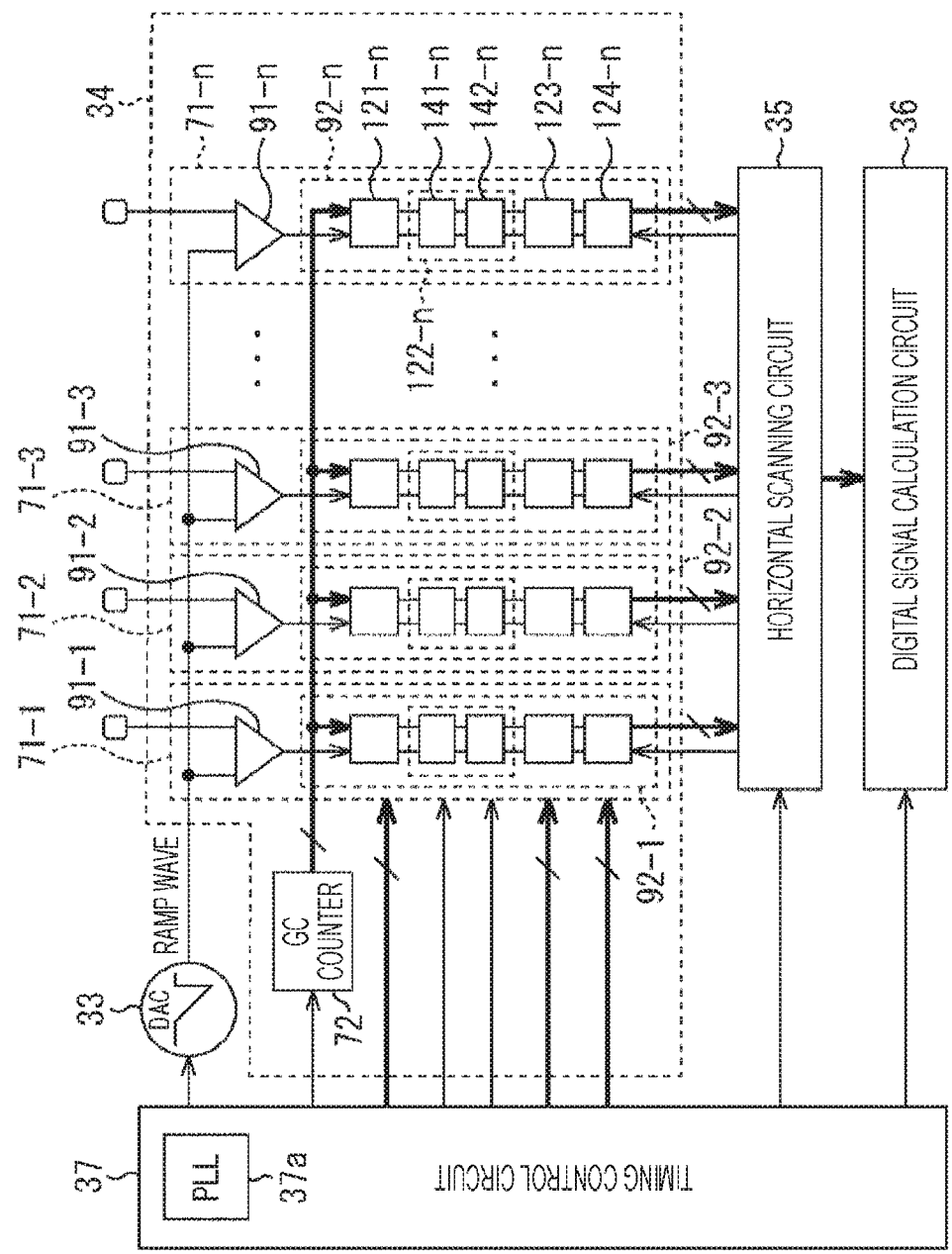
FIG. 2 is a diagram illustrating an example of the configuration of the periphery of a column counter illustrated in FIG. 1.

Next, the configuration of the column counter 92 in the ADC 34 illustrated in FIG. 1 will be described with reference to FIG. 2. Note that FIG. 2 illustrates the detailed configuration of the periphery of the ADC 34 including the column counter 92 in the imaging element 11 illustrated in FIG. 1.

The column counters 92-1 to 92-$n$ include gray code (GC) latches 121-1 to 121-$n$, arithmetic logic units (ALUs) 122-1 to 122-$n$, temporary latches 123-1 to 123-$n$, and interface (IF) latches 124-1 to 124-$n$, respectively.

The gray code (GC) latch 121 operates on the basis of the timing control signal from the timing control circuit 37 and latches the gray code supplied from the GC counter 72 at the time when a signal indicating that a voltage value of the pixel signal is greater than the ramp wave is supplied from the comparator 91.

The ALU 122 converts the gray code corresponding to the pixel signal which has been latched by the GC latch 121 into a binary code, using the temporary latch 123. In addition, the ALU 122 performs correlated double sampling (CDS) for the binary code and outputs the binary code to the IF latch 124.

Specifically, the ALUs 122-1 to 122-$n$ include code converters 141-1 to 141-$n$ and full adders 142-1 to 142-$n$, respectively. The code converter 141 converts the gray code latched by the GC latch 121 into a binary code and outputs the binary code to the full adder 142. The full adder 142 adds the binary code and the binary code stored in the temporary latch 123 and outputs the addition result to the IF latch 124.

That is, first, the GC latch 121 latches a gray code which corresponds to a pixel signal called a P-phase pixel signal in a state in which the pixels 51 are reset. Therefore, the code converter 141 converts the gray code corresponding to the P-phase pixel signal latched in the GC latch 121 into a binary code and outputs the binary code to the full adder 142. In this case, the full adder 142 adds (subtracts) the received binary code and the binary code in which all bits are 0 and which is latched in the temporary latch 123 in which all bits with a value of 0 are latched after reset and latches the added binary code in the temporary latch 123. The P-phase binary code is latched in the temporary latch 123 by the above-mentioned process.

Then, in a case where the GC latch 121 is reset, a gray code corresponding to a pixel signal which corresponds to the amount of light received by the pixels 51 and is called a D-phase pixel signal is latched in the GC latch 121. Then, the code converter 141 converts the gray code corresponding to the D-phase pixel signal which is latched in the GC latch 121 into a binary code and outputs the binary code to the full adder 142. In this case, the full adder 142 adds (substantially subtracts) the binary code of the P-phase pixel signal latched in the temporary latch 123 to the binary code of the D-phase pixel signal and latches the added binary code in the IF latch 124. That is, the difference between the binary code of the P-phase pixel signal and the binary code of the D-phase pixel signal is calculated by this process. In practice, the pixel signal including the binary code subjected to CDS is latched in the IF latch 124.

<Example of Configuration of Counter Latch Using Ripple Counter>

The counter latch according to the present disclosure converts pixel signals including P-phase and D-phase gray codes into binary codes, using calculation with the ALU 122 and the temporary latch 123, and calculates the difference therebetween to calculate a pixel signal subjected to CDS.

However, the counter latch may be, for example, a counter latch using a ripple counter.

Figure 3:
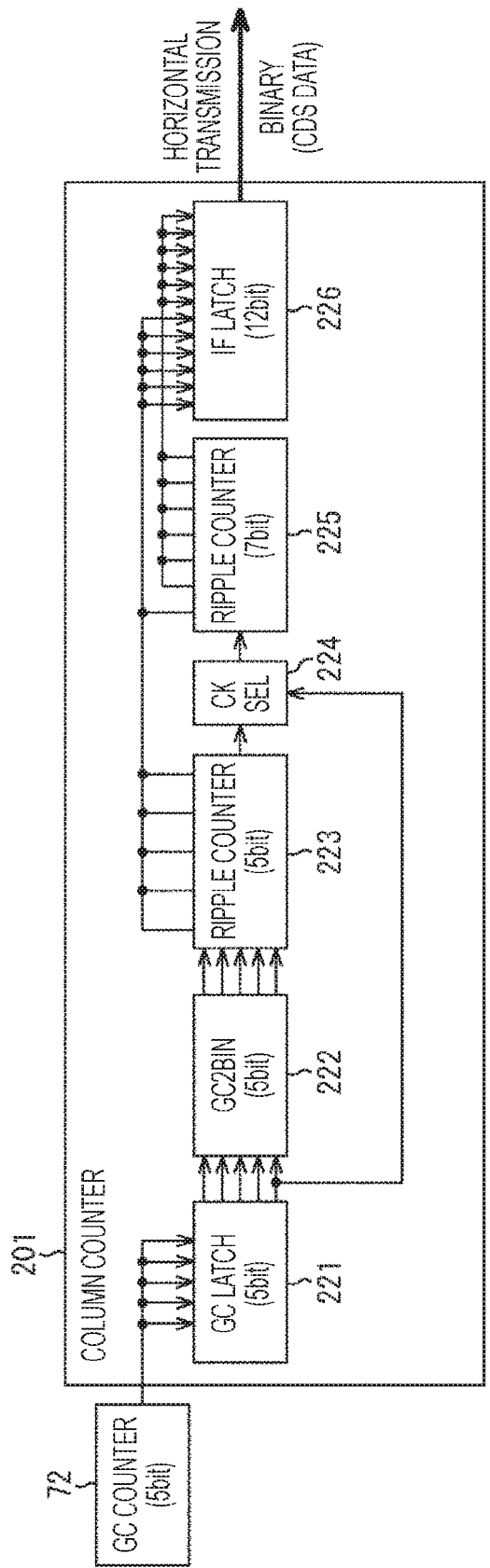
FIG. 3 is a diagram illustrating an example of the configuration of a column counter in a case where a ripple counter is used.

FIG. 3 illustrates an example of the configuration of a counter latch 201 using a ripple counter. Note that, in FIG. 3, it is assumed that the GC counter 72 generates a 5-bit gray code.

The counter latch 201 illustrated in FIG. 3 includes a 5-bit GC latch 221, a code converter (GC2BIN) 222, a 5-bit ripple counter 223, a clock selector (CKSEL) 224, and a 7-bit ripple counter 225. The counter latch 201 includes the GC latch 221, the code converter (GC2BIN) 222, the 5-bit ripple counter 223, the clock selector (CKSEL) 224, the 7-bit ripple counter 225, and a 12-bit IF latch 226.

The operations of all of the GC latch 221, the code converter (GC2BIN) 222, the 5-bit ripple counter 223, the clock selector (CKSEL) 224, the 7-bit ripple counter 225, and the 12-bit IF latch 226 are controlled by timing control signals supplied from a timing control circuit (not illustrated).

The GC latch 221 latches a gray code corresponding to a pixel signal among the gray codes supplied from the GC counter 72 on the basis of the determination result of a comparator (not illustrated).

The code converter 222 converts the gray code corresponding to the pixel signal latched in the GC latch 221 into a binary code and supplies the binary code to the ripple counter 223.

Since the most significant code of the gray code latched in the GC latch 221 has the same value as that in the binary code, the clock selector 224 reads the gray code as the binary code and supplies the gray code to the ripple counter 225.

The ripple counter 223 counts the lower-order 5 bits of the binary code output from a stage behind the ripple counter 223. In addition, the ripple counter 225 counts the higher-order 7 bits of the binary code output from a stage behind the ripple counter 225.

The clock selector 224 combines the binary code of the lower-order 5 bits counted by the ripple counter 223 and the binary code of the higher-order 7 bits counted by the ripple counter 225 to generate a 12-bit binary code and latches the 12-bit binary code in the IF latch 226.

The IF latch 226 latches the 12-bit binary code converted from the gray code corresponding to the pixel signal.

The ripple counters 223 and 225 store the binary code corresponding to the P-phase pixel signal as a negative value and add the D-phase pixel signal without any change. As a result, the counter latch 201 illustrated in FIG. 3 converts the P-phase and D-phase pixel signals including the gray codes supplied from the GC counter 72 into binary codes, calculates the difference therebetween, and outputs a pixel signal which includes a 12-bit binary code and has been subjected to CDS.

However, in the counter latch 201 illustrated in FIG. 3, since the code converter 222 and the ripple counters 223 and 225 are essential, it is necessary to arrange a large number of D flip-flops (hereinafter, also referred to as DFFs) forming the code converter 222 and the ripple counters 223 and 225. As a result, the mounting area increases and power consumption also increases.

<Example of Configuration of Counter Latch Using Only Gray Code>

Therefore, it is considered that the ripple counter is omitted and only the gray code is used in the counter latch.

Figure 4:
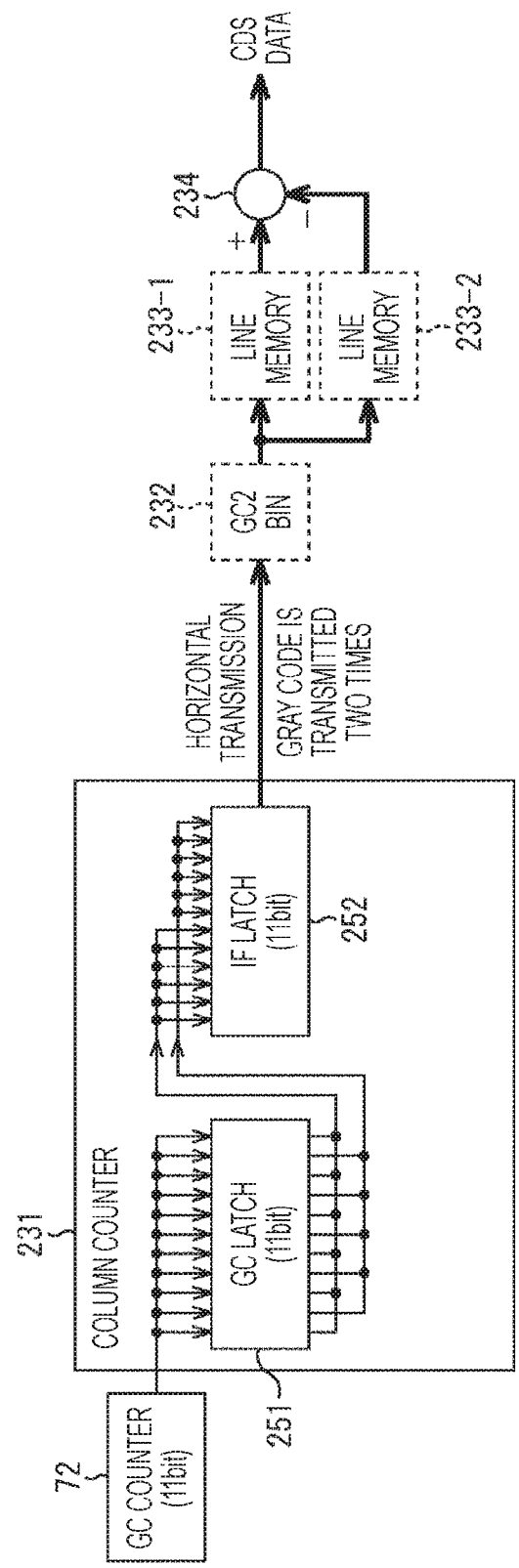
FIG. 4 is a diagram illustrating an example of the configuration of a column counter that performs a process with only a gray code.

FIG. 4 is an example of the configuration of the counter latch in which the ripple counter is omitted and only the gray code is used.

A counter latch 231 illustrated in FIG. 4 includes an 11-bit GC latch 251 and an 11-bit IF latch 252.

The GC latch 251 latches an 11-bit gray code corresponding to a pixel signal supplied from the GC counter 72.

The IF latch 252 latches an 11-bit gray code corresponding to the pixel signal latched in the GC latch 251 and horizontally transmits the 11-bit gray code to a code converter (GC2BIN) 232.

The code converter 232 converts the 11-bit gray code horizontally transmitted by the IF latch 252 into a binary code. For example, the code converter 232 stores a P-phase binary code in a line memory 233-1 and stores a D-phase binary code in a line memory 233-2.

The subtracter 234 subtracts the binary code of the P-phase pixel signal stored in the line memory 233-1 from the binary code of the D-phase pixel signal stored in the line memory 233-2 and outputs a pixel signal subjected to CDS.

That is, the counter latch 231 illustrated in FIG. 4 needs to horizontally transmit each of the P-phase and D-phase gray codes to the code converter (GC2BIN) 232 once.

In the configuration of the counter latch 231 in FIG. 4, since the horizontal transmission rate of the IF latch 252 limits a frame rate, a configuration for increasing the horizontal transmission rate is required.

In addition, it is necessary to ensure a mounting area for providing a configuration for increasing the processing speed of the line memories 233-1 and 233-2 or the horizontal transmission rate.

Further, there is a possibility that power consumption for increasing the horizontal transmission rate will increase.

Furthermore, for example, horizontal transmission timing control for avoiding noise caused by a horizontal transmission operation is complicated.

<Operation of Column Counter Illustrated in FIG. 2>

Therefore, the column counter 92 in the imaging element 11 according to the present disclosure does not use a ripple counter, converts the P-phase and D-phase gray codes which are gray codes into D-phase and P-phase binary codes, respectively, calculates the difference therebetween, and outputs a pixel signal subjected to CDS.

Here, the operation of the column counter 92 will be described with reference to FIG. 5.

For example, it is assumed that the GC latch 121, the ALU 122, the temporary latch 123, and the IF latch 124 are reset and the GC latch 121 and the temporary latch 123 latch the gray code and the binary code in which all bits are 0, respectively.

Here, the GC latch 121 latches, for example, a gray code corresponding to an 11-bit P-phase pixel signal generated by the GC counter 72. Note that the number of bits in the gray code may be any value other than 11 bits.

The code converter 141 of the ALU 122 converts the gray code corresponding to the P-phase pixel signal latched in the GC latch 121 into a binary code two bits by two bits and outputs the binary code to the full adder 142.

The full adder 142 add (subtracts) 0 which is the binary code stored in the temporary latch 123 from the binary code converted from the gray code by the code converter 141 and latches the addition result in the temporary latch 123.

The above-mentioned process is repeatedly performed for every two bits and binary data corresponding to an 11-bit P-phase pixel signal is latched in the temporary latch 123.

Then, after the GC latch 121 is reset, the GC latch 121 latches, for example, the gray code corresponding to the 11-bit D-phase pixel signal generated by the GC counter 72.

The code converter 141 of the ALU 122 converts the gray code corresponding to the D-phase pixel signal latched in the GC latch 121 into a binary code two bits by two bits and outputs the binary code to the full adder 142.

The full adder 142 adds (subtracts) the binary code corresponding to the P-phase pixel signal stored in the temporary latch 123 from the binary code corresponding to the D-phase pixel signal converted from the gray code by the code converter 141 and latches a 12-bit binary code in the IF latch 124.

The above-mentioned process is repeatedly performed for every two bits and binary data corresponding to the 12-bit pixel signal subjected to CDS is latched in the IF latch 124.

<Calculation Using ALU>

Calculation using the code conversion unit 141 and the full adder 142 of the ALU 122 will be described.

Figure 6:
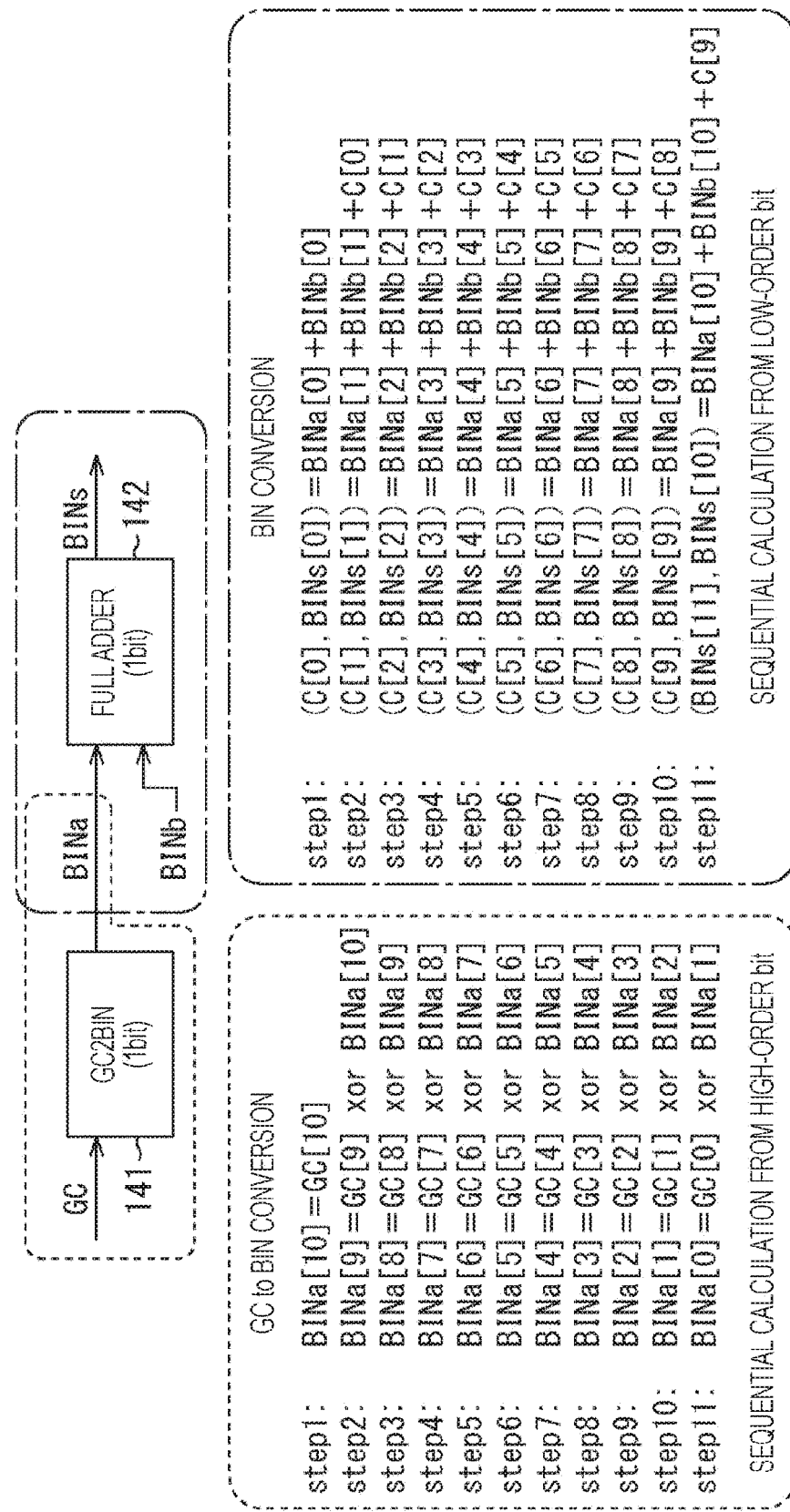
FIG. 6 is a diagram illustrating an example of a process of an ALU in the column counter.

In a case where the code conversion unit 141 converts a gray code into a binary code one bit by one bit, the code conversion unit 141 repeatedly performs, for example, calculation illustrated on the left side of FIG. 6.

First, GC[10] that is data corresponding to the eleventh bit which is the most significant bit of an 11-bit gray code is equivalent to BINa[10] that is data corresponding to the eleventh bit which is the most significant bit of an 11-bit binary code. Therefore, the code conversion unit 141 calculates BINa[10] from GC[10] in Processing Step 1 which is an initial process.

Then, BINa[9] that is data corresponding to the tenth bit of the binary code is the exclusive OR (XOR) of GC[9] that is data corresponding to the tenth bit of the gray code and BINa[10] that is data corresponding to the eleventh bit which is a high-order bit. Therefore, the code conversion unit 141 calculates BINa[9] as the exclusive OR of BINa[10] and GC[9] in Processing Step 2.

In addition, BINa[8] that is data corresponding to the ninth bit of the binary code is the exclusive OR (XOR) of GC[8] that is data corresponding to the ninth bit of the gray code and BINa[9] that is data corresponding to the tenth bit which is a high-order bit. Therefore, the code conversion unit 141 calculates BINa[8] as the exclusive OR of BINa[9] and GC[8] in Processing Step 3.

Similarly in the following, Processing Steps 4 to 11 are repeatedly performed to sequentially convert the gray codes CG[10], CG[9], CG[8], ..., CG[0] corresponding to 11 bits into the binary codes BINa[10], BINa[9], BINa[8], ..., BINa[0] corresponding to 11 bits in descending order of bit.

In addition, after the gray code is converted into the binary code as illustrated on the left side of FIG. 6, the full adder 142 repeatedly performs calculation illustrated on the right side of FIG. 6.

Note that, in FIG. 6, for example, since there is a binary code that has been latched in the temporary latch 123 in advance, the binary code latched in the temporary latch 123 is represented by BINb[0] to BINb[10]. In addition, in a case where the gray code corresponding to the P-phase pixel signal is converted into a binary code, all of the bits of the binary code latched in the temporary latch 123 are 0. In addition, in a case where the gray code corresponding to the D-phase pixel signal is converted into a binary code, all of the bits of the binary code latched in the temporary latch 123 correspond to those of the P-phase pixel signal.

That is, in Processing Step 1 which is the initial process, the full adder 142 adds (subtracts) the binary code BINa[0] corresponding to the first bit which is the least significant bit of the binary code supplied from the code converter 141 and a binary code BINb[0] corresponding to the first bit which is the least significant bit of the binary code read from the temporary latch 123 to calculate a binary code (C[0], BINs[0]) including the least significant bit and a carry bit. Here, C[0] is the carry bit of the first bit.

Then, in Processing Step 2, the full adder 142 adds (subtracts) the binary code BINa[1] corresponding to the second bit of the binary code supplied from the code converter 141, a binary code BINb[1] corresponding to the second bit which is the least significant bit of the binary code read from the temporary latch 123, and C[0] which is the carry bit of the first bit to calculate a binary code (C[1], BINs[1]) including the second bit and a carry bit thereof. Here, C[1] is the carry bit of the second bit.

Further, in Processing Step 3, the full adder 142 adds (subtracts) the binary code BINa[2] corresponding to the third bit of the binary code supplied from the code converter 141, a binary code BINb[2] corresponding to the third bit of the binary code read from the temporary latch 123, and C[1] which is the carry bit of the second bit to calculate a binary code (C[2], BINs[2]) including the third bit and a carry bit thereof. Here, C[1] is the carry bit of the second bit.

Similarly in the following, Processing Steps 4 to 11 are repeatedly performed to add (subtract) the binary codes BINb[0] to BINb[10] read from the temporary latch 123 and the binary codes BINa[0] to BINa[10] supplied from the code converter 141 to calculate a pixel signal which includes binary codes BINs[0] to BINs[11] corresponding to 12 bits and has been subjected to correlated double sampling (CDS).

However, in the case of the process described with reference to FIG. 6, as illustrated on the left side of FIG. 6, the code conversion unit 141 sequentially calculates the low-order bits from the high-order bits to calculate the binary code corresponding to the D-phase pixel signal in the order of BINa[10], BINa[9], BINa[8], ..., BINa[0] in Processing Steps 1 to 11.

In contrast, as illustrated on the right side of FIG. 6, the full adder 142 sequentially calculates the high-order bits from the low-order bits to calculate the binary code indicating the pixel signal subjected to CDS in the order of BINs[1], BINs[2], BINs[3], ..., BINs[11] in Processing Steps 1 to 11.

Therefore, for example, even in a case where the code converter 141 outputs the binary code BINa[10] corresponding to the eleventh bit to the full adder 142 without any change in Processing Step 1, it is difficult to perform calculation since the necessary binary code BINa[0] corresponding to the first bit has not been calculated in Processing Step 1 of the full adder 142.

That is, the full adder 142 needs to perform Processing Step 1 after the code converter 141 completes the process in Processing Steps 1 to 11.

As a result, it is difficult for the code converter 141 and the full adder 142 to continuously calculate the binary codes of the same bits. Therefore, it is difficult to increase the processing speed and a configuration for storing the 11-bit binary code which is the conversion result of the code converter 141 is required. As a result, there is a possibility that the mounting area will increase.

<Continuous Calculation for Same Bit>

Therefore, the code converter 141 in the ALU 122 according to the present disclosure calculates a gray code corresponding to the least significant bit in advance using a predetermined process and sequentially generates binary codes from the least significant bit using the gray code.

That is, as described above, since the most significant bit of the binary code is equivalent to the most significant bit of the gray code, the relationship represented by the following Expression (1) is established.

$$BIN[MSB]=GC[MSB] \quad (1)$$

Here, BIN[ ] indicates a binary code, GC[ ] indicates a gray code, and MSB indicates the most significant bit.

In addition, a binary code BIN[n] corresponding to an n-th bit is represented by the following Expression (2).

$$BIN[n]=GC[n] \; xor \; BIN[n+1] \quad (2)$$

Here, xor indicates an exclusive OR.

The relationship represented by Expression (2) can be rearranged to the following Expression (3).

$$BIN[n+1]=GC[n] \; xor \; BIN[n] \quad (3)$$

Therefore, in a case where the binary code BIN[0] corresponding to the least significant bit can be calculated by Expression (3), the code converter 141 can convert the gray code into the binary code from the least significant bit.

Here, the least significant bit BIN[LSB] (=BIN[0]) of the binary code can be calculated by the following Expression (4).

$$BIN[0]=GC[MSB] \; xor \; GC[MSB-1] \; xor \; GC[MSB-2] \; xor \\ \ldots xor \; GC[1] \quad (4)$$

That is, the least significant bit BIN[0] of the binary code is calculated by the exclusive OR of all of the bits of the gray code.

<Calculation by ALU According to the Present Disclosure>

Therefore, the code converter 141 and the full adder 142 of the ALU 122 according to the present disclosure convert the gray code to the binary code according to the procedure illustrated in FIG. 7 and further perform an addition (subtraction) process related to CDS.

P[0] that is parity data corresponding to the first bit which is the least significant bit of an 11-bit parity is the exclusive OR of GC[0] which is data corresponding to the first bit of the gray code and 0. Therefore, the code conversion unit 141 calculates P[0] which is the first bit of the 11-bit parity as the exclusive OR of GC[0] and 0 in Processing Step 1.

Then, P[1] which is parity data corresponding to the second bit of the 11-bit parity is the exclusive OR of GC[1] which is data corresponding to the second bit of the gray code and the parity P[0] corresponding to the first bit. Therefore, the code conversion unit 141 calculates P[1] which is the second bit of the 11-bit parity as the exclusive OR of GC[1] and P[0] in Processing Step 2.

In addition, P[2] which is parity data corresponding to the third bit of the 11-bit parity is the exclusive OR of GC[2] which is data corresponding to the third bit of the gray code and the parity P[1] corresponding to the second bit. Therefore, the code conversion unit 141 calculates P[2] which is the third bit of the 11-bit parity as the exclusive OR of GC[2] and P[1] in Processing Step 3.

Similarly in the following, P[9] which is the tenth bit of the 11-bit parity is calculated in Processing Steps 4 to 10. As a result, the parity P[9] is calculated as the exclusive OR of GC[0] to GC[8] corresponding to the first to tenth bits and the parity data.

Then, in Processing Step 11, the code converter 141 calculates the least significant bit BINa[0] of the binary code as the exclusive OR of GC[10] which is the most significant bit of the gray code and the parity P[9] corresponding to the tenth bit and outputs the least significant bit BINa[0] to the full adder 142.

That is, in Processing Steps 1 to 11, the least significant bit BINa[0] of the binary code represented by Expression (4) is calculated.

Here, the full adder 142 can acquire the least significant bit BINb[0] of the binary code from the temporary latch 123. Therefore, in Processing Step 11, further, the full adder 142 continuously adds (subtracts) the binary code BINa[0] corresponding to the first bit which is the least significant bit of the binary code supplied from the code converter 141 and the binary code BINb[0] corresponding to the first bit which is the least significant bit of the binary code read from the temporary latch 123 to calculate a binary code (C[0], BINs [0]) including the least significant bit and the carry bit.

Note that, hereinafter, it is assumed that the process of the code converter 141 calculating the least significant bit BINb[0] of the binary code in Processing Steps 1 to 11 is referred to as preprocessing of the code conversion unit 141.

Then, in Processing Step 12, the code converter 141 calculates a binary code BINa[1] corresponding to the second bit of the binary code as the exclusive OR of GC[1] which is the second bit of the gray code and BINa[0] which is the least significant bit of the binary code and outputs the binary code BINa[1] to the full adder 142.

Further, then, the full adder 142 adds (subtracts) the binary code BINa[1] corresponding to the second bit of the binary code supplied from the code converter 141, the binary code BINb[1] corresponding to the second bit of the binary code read from the temporary latch 123, and the carry bit C[0] to calculate a binary code (C[1], BINs[1]) including the second bit and the carry bit.

In addition, in Processing Step 13, the code converter 141 calculates a binary code BINa[2] corresponding to the third bit of the binary code as the exclusive OR of GC[2] which is the third bit of the gray code and the binary code BINa[1] corresponding to the second bit and outputs the binary code BINa[2] to the full adder 142.

Further, then, the full adder 142 adds (subtracts) the binary code BINa[2] corresponding to the third bit of the binary code supplied from the code converter 141, the binary code BINb[2] corresponding to the third bit of the binary code read from the temporary latch 123, and the carry bit C[1] to calculate a binary code (C[2], BINs[2]) including the second bit and the carry bit.

Similarly in the following, Processing Steps 14 to 21 are repeatedly performed to calculate binary codes BINs[0] to BINs[11]) corresponding to 12 bits.

In the above-mentioned process, the binary code BINa[0] corresponding to the least significant bit can be calculated by the preprocessing of the code converter 141. In addition, since the binary code BINa[0] corresponding to the least significant bit can be calculated by the preprocessing, the code converter 141 can sequentially convert the gray code into the binary code from the least significant bit to the high-order bit. In addition, since the code converter 141 can sequentially convert the gray code into the binary code from the least significant bit to the high-order bit, the full adder 142 calculates the difference between the conversion result of the code converter 141 and the binary code latched by the temporary latch 123 from the least significant bit to the high-order bit, continuously using the conversion result, to apply CDS.

<Example of Circuit Configuration of Code Converter and Full Adder Forming ALU for Converting Gray Code into Binary Code One Bit by One Bit>

Next, an example of a circuit configuration for implementing the code converter 141 and the full adder 142 forming the ALU 122 in a case where a gray code is converted into a binary code one bit by one bit will be described with reference to FIG. 8.

Figure 8:
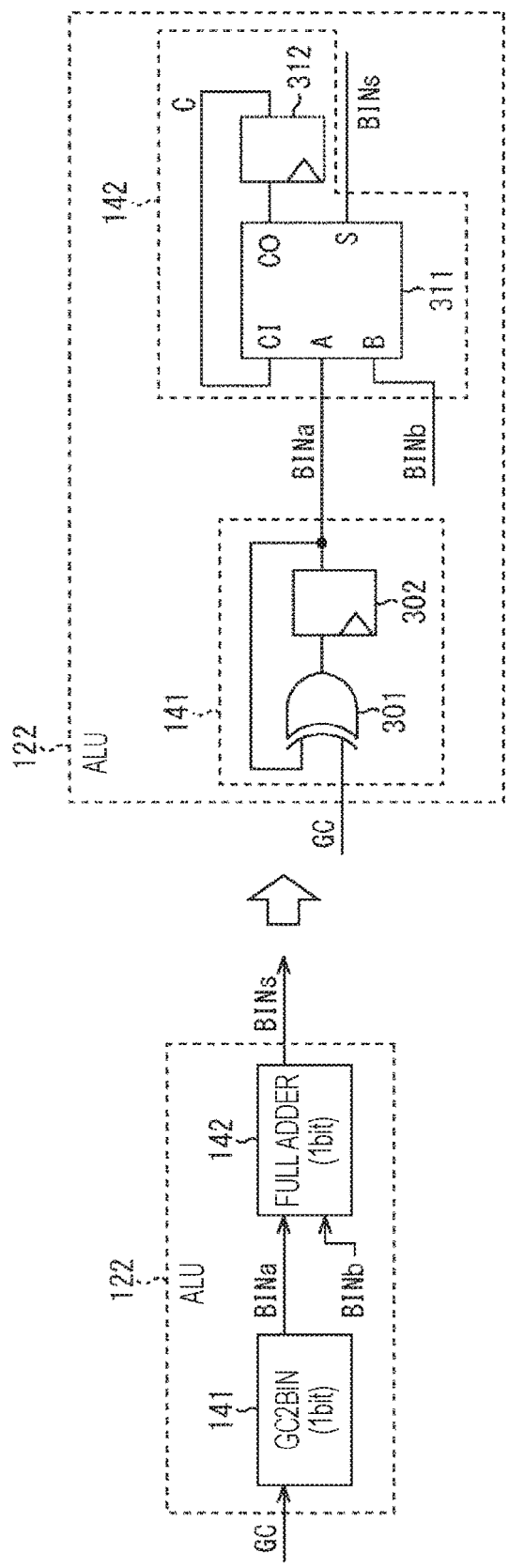
FIG. 8 is a diagram illustrating an example of the configuration of the ALU in a case where a code is converted one bit by one bit and full addition is performed.

As illustrated in FIG. 8, for example, the code converter 141 includes an XOR circuit 301 and a D flip-flop circuit (DFF) 302.

The XOR circuit 301 outputs the exclusive OR of an input value GC[n] of the gray code and the conversion result BINa[n−1] obtained by previous conversion into the binary code as the conversion result BINa[n] of the binary code to the DFF 302.

The DFF 302 temporarily stores the conversion result BINa[n] which is obtained by converting the gray code into the binary code and is output from the XOR circuit 301 and outputs the conversion result BINa[n] to the XOR circuit 301 and the full adder 142 at the next timing.

The full adder 142 includes an adder circuit 311 and a DFF 312.

The adder circuit 311 has an input terminal A that receives the input of the binary code BINa[n] supplied from the code converter 141, an input terminal B that receives the binary code BINb[n] supplied from the temporary latch 123, an output terminal S that outputs the binary code BINs[n] which is the addition result of the binary code BINa[n] supplied from the code converter 141, the binary code BINb[n] supplied from the temporary latch 123, and the carry bit C[n−1], an output terminal CO that outputs the carry bit C[n] to the DFF 312, and an input terminal CI that receives the input of the carry bit C[n−1] of the previously processed bit which is supplied from the DFF 312.

The adder circuit 311 outputs the addition result of the binary code BINa[n] input to the input terminal A from the code converter 141, the binary code BINb[n] input to the input terminal B from the temporary latch 123, and the carry bit C[n−1] of the previously processed bit which is latched in the DFF 312 as the binary code BINs[n] from the output terminal S. At that time, the adder circuit 311 outputs the carry bit C[n] to the DFF 312 so as to be stored in the DFF 312.

That is, the ALU 122 that converts the gray code into the binary code one bit by one bit as illustrated in FIG. 7 is implemented by the circuit configuration illustrated in FIG. 8.

<Example of Circuit Configuration of Code Converter and Full Adder Forming ALU for Converting Gray Code into Binary Code Two Bits by Two Bits>

Figure 5:
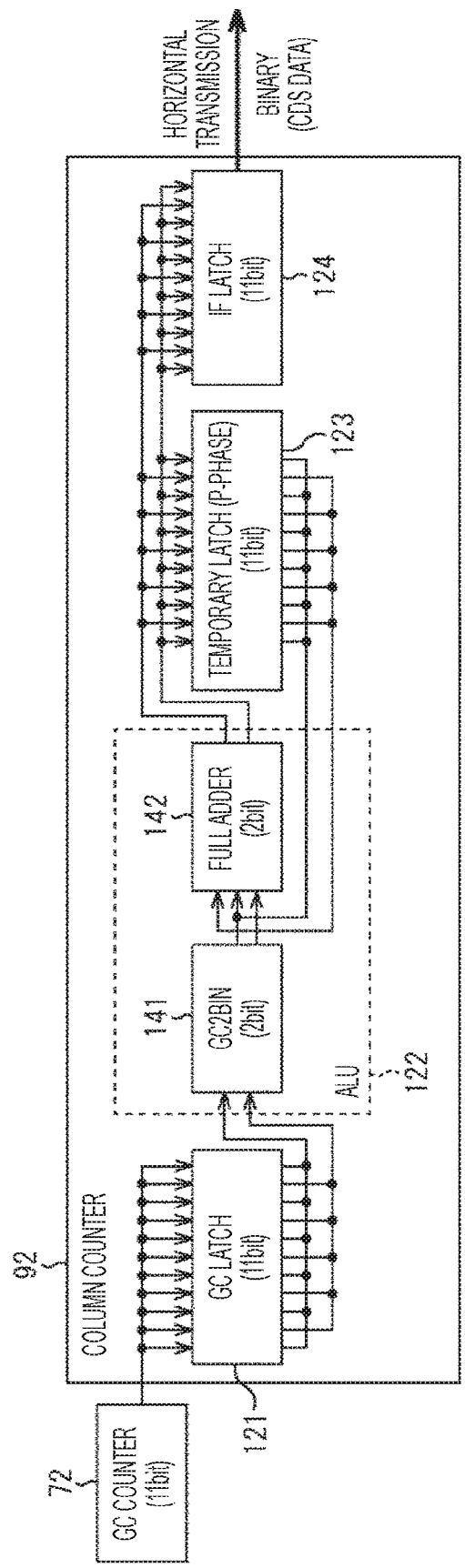
FIG. 5 is a diagram illustrating an example of the configuration of the column counter illustrated in FIG. 1.

However, the ALU of the column counter 92 illustrated in FIG. 5 in the present disclosure converts a gray code into a binary code two bits by two bits.

Therefore, an example of the circuit configuration of the code converter 141 and the full adder 142 forming the ALU 122 for converting a gray code into a binary code two bits by two bits, to which the circuit configuration of the code converter 141 and the full adder 142 forming the ALU 122 for converting a gray code into a binary code one bit by one bit as illustrated in FIG. 8 is applied, will be described with reference to FIG. 9.

Figure 9:
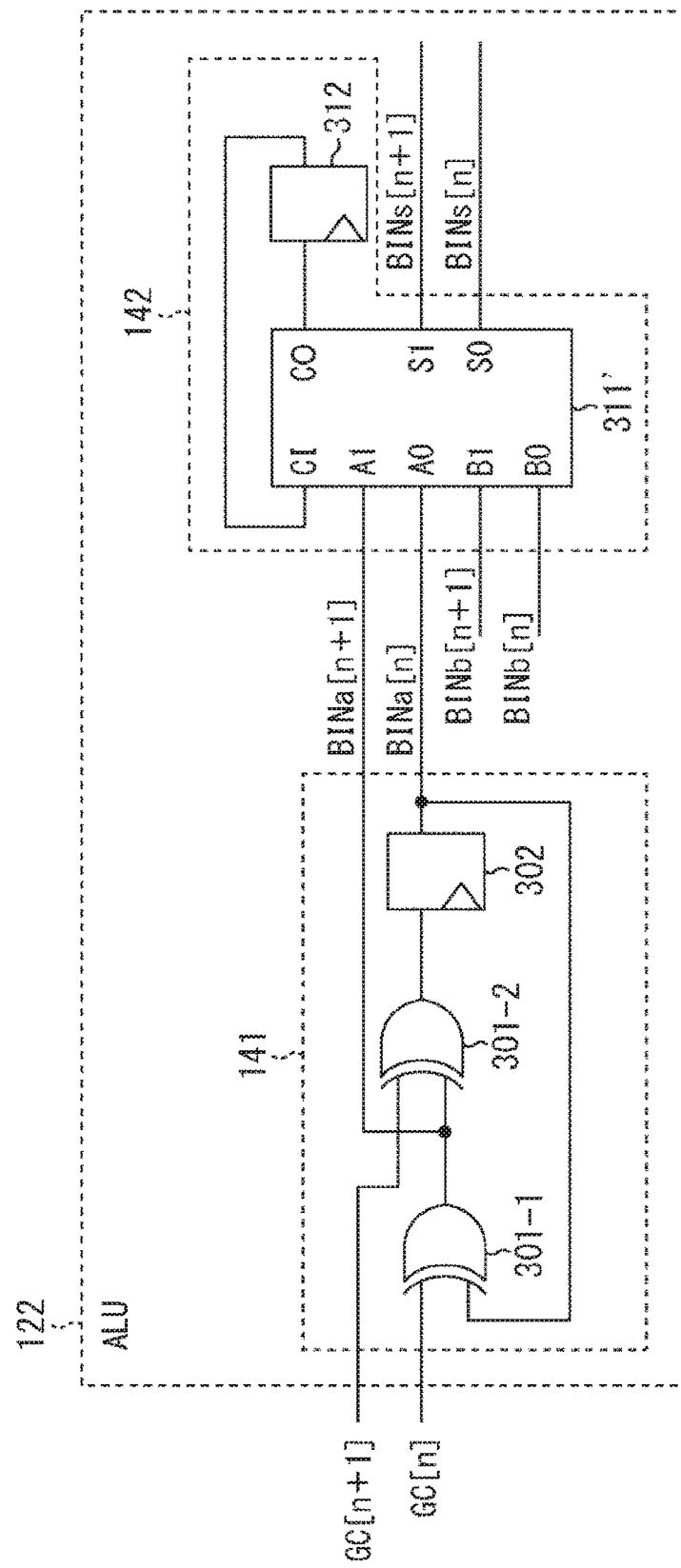
FIG. 9 is a diagram illustrating an example of the configuration of the ALU in a case where a code is converted two bits by two bits and full addition is performed.

Note that, in the configuration illustrated in FIG. 9, components having the same functions as those in the configuration illustrated in FIG. 8 are denoted by the same reference numerals and the description thereof will be appropriately omitted.

The code converter 141 illustrated in FIG. 9 includes XOR circuits 301-1 and 301-2 instead of the XOR circuit 301 illustrated in FIG. 8 and gray codes GC[n] and GC[n+1], each of which has consecutive bits, are input to the XOR circuits 301-1 and 301-2, respectively. The XOR circuit 301-1 calculates the exclusive OR of the gray code GC[n] and a binary code BINa[n] which is the result processed 1 bit before and outputs the calculation result to the XOR circuit 301-2 and an adder circuit 311' of the full adder 142.

The XOR circuit 301-2 calculates the exclusive OR of the gray code GC[n+1] and a binary code BINa[n+1] which is the output of the XOR circuit 301-1 and outputs the calculation result as the binary code BINa[n] to the DFF 302.

The full adder 142 illustrated in FIG. 9 includes the adder circuit 311' instead of the adder circuit 311 illustrated in FIG. 8.

The adder circuit 311' adds the binary code BINa[n+1] input to an input terminal A1 from the code converter 141, a binary code BINb[n+1] input to an input terminal B1 from the temporary latch 123, and the carry bit C[n] of the previously processed bit stored in the DFF 312 and outputs a binary code BINs[n+1] which is the addition result from an output terminal S1.

In addition, the adder circuit 311' adds the binary code BINa[n] input to an input terminal A0 from the code converter 141, a binary code BINb[n] input to an input terminal B0 from the temporary latch 123, and the carry bit C[n−1] of the previously processed bit stored in the DFF 312 and outputs a binary code BINs [n] which is the addition result from an output terminal S0.

At that time, the adder circuit 311' outputs the carry bits C[n] and C[n+1] to the DFF 312 so as to be stored in the DFF 312.

That is, the ALU 122 in which each process illustrated in FIG. 7 is performed for every two steps and a gray code is converted into a binary code two bits by two bits is implemented by the circuit configuration illustrated in FIG. 9.

<ALU Using Complement Number>

In the ALU 122 illustrated in FIGS. 8 and 9, since the addition process is actually performed in the adder circuits 311 and 311', the temporary latch 123 needs to invert the sign of a value.

Therefore, the original gray code latched by the GC latch 121 may be converted into a gray code which is the complement of the original gray code and the code converter 141 may convert the gray code into a complementary binary code. The full adder 142 may add the complementary binary code and a normal binary code which is not a complementary code, logically invert the addition result, and output the logically inverted code. In this way, substantial subtraction is performed and a binary code which is not a complementary code corresponding to a pixel signal is output.

Note that, hereinafter, it is assumed that the complement of the gray code G[n] is represented by a gray code !GC[n] and the complement of the binary code BIN[n] is represented by a binary code !BIN[n].

Figure 10:
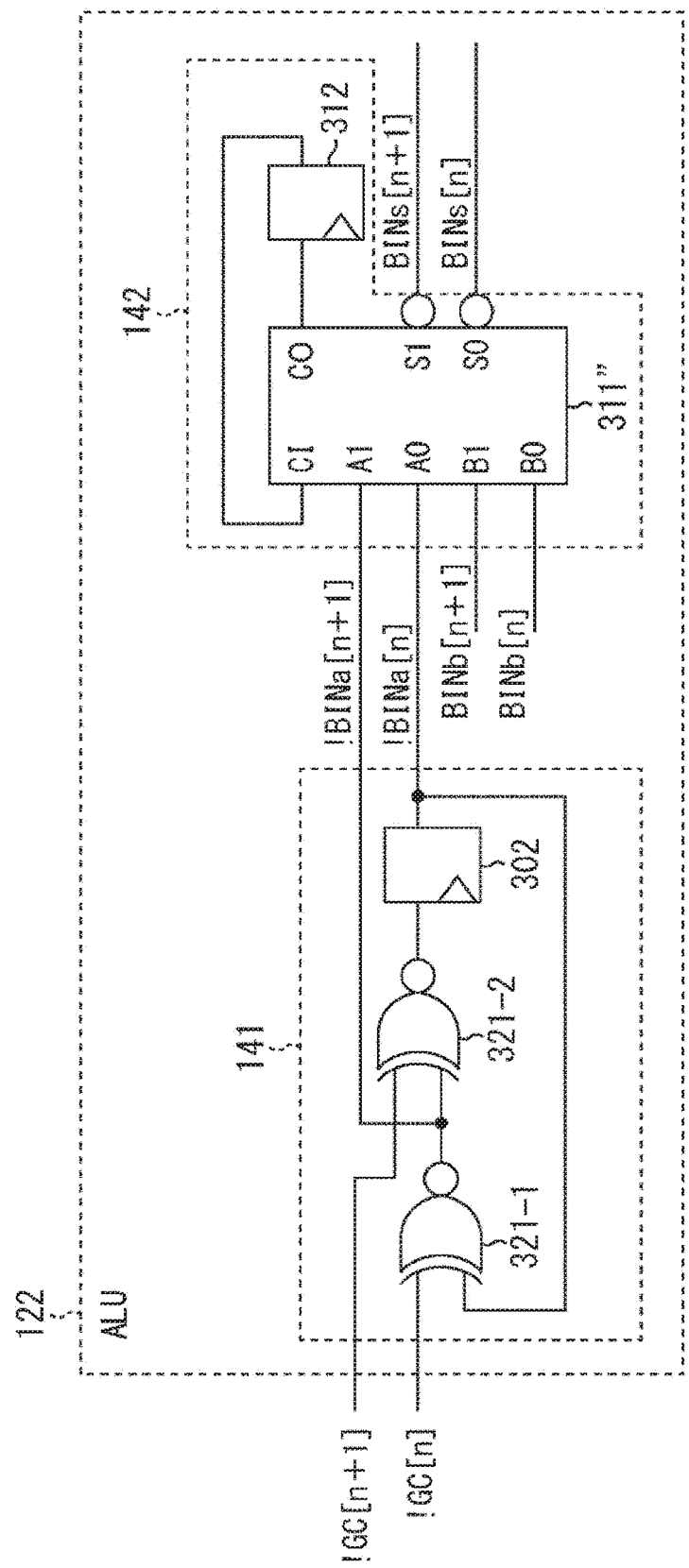
FIG. 10 is a diagram illustrating an example of the configuration of the ALU in a case where a code is converted two bits by two bits using a complement number of a gray code and full addition is performed.

FIG. 10 illustrates an example of the configuration of the ALU 122 that performs subtraction using a complement number.

That is, the code converter 141 of the ALU 122 illustrated in FIG. 10 includes XNOR circuits 321-1 and 321-2 that perform an exclusive NOR operation, instead of the XOR circuits 301-1 and 301-2 illustrated in FIG. 9. Note that, hereinafter, the exclusive NOR operation is simply referred to as an XNOR operation.

The XNOR circuit 321-1 outputs the result of the exclusive NOR of a gray code !GC[n] and a binary code !BIN[n] which is the result processed 1 bit before as a binary code !BINa[n+1] which is a conversion result to the XNOR circuit 321-2 and an adder circuit 351 of the full adder 142.

The XNOR circuit 321-2 calculates the exclusive NOR of a gray code !GC[n+1] and the binary code !BINa[n+1] which is the output of the XNOR circuit 321-1 and outputs the calculation result as the binary code !BINa[n] which is the conversion result to the DFF 302.

The full adder 142 illustrated in FIG. 10 includes the adder circuit 311" instead of the adder circuit 311' illustrated in FIG. 9.

The adder circuit 311" adds the binary code !BINa[n+1] input to an input terminal A1 from the code converter 141, a binary code BINb[n+1] input to an input terminal B1 from the temporary latch 123, and the carry bit C[n] of the previously processed bit latched in the DFF 312, logically inverts the addition result, and outputs a binary code BINs[n+1] which is the addition result from an output terminal S1.

The adder circuit 311" adds the binary code !BINa[n] input to an input terminal A0 from the code converter 141, a binary code BINb[n] input to an input terminal B0 from the temporary latch 123, and the carry bit C[n−1] of the previously processed bit latched in the DFF 312, logically inverts the addition result, and outputs a binary code BINs[n] which is the addition result from an output terminal S0.

<Data Transfer in ALU Illustrated in FIG. 10>

Data is transferred by the ALU 122 having the circuit configuration illustrated in FIG. 10 as illustrated in FIG. 11.

That is, in a case where a P-phase pixel signal is detected and a corresponding gray code is supplied by the GC counter 72, a gray code Pval_gc corresponding to the P-phase pixel signal is stored in the GC latch 121 (P-phase count in FIG. 11).

For example, a logical inversion function is provided in the output terminal of the GC latch 121 or the like and the code converter 141 of the ALU 122 converts a logically inverted gray code !Pval_gc (the output side of the GC latch 121) which is the complement of the gray code Pval_gc stored in the GC latch 121 into a binary code !Pval. In this case, a binary code (2'b00Fix) in which all bits are 0 is output to the output side of the temporary latch 123. Then, the full adder 142 adds (subtracts) the binary code !Pval and 0 stored in the temporary latch 123, logically inverts the addition result, and outputs the addition result as a binary code Pval (=!(!Pval+0)) which is the P-phase pixel signal so as to be stored in the temporary latch 123 (P-phase latch transmission in FIG. 11).

Then, in a case where a D-phase pixel signal is detected and a corresponding gray code is supplied by the GC counter 72, a gray code Dval_gc corresponding to the D-phase pixel signal is stored in the GC latch 121 (D-phase count in FIG. 11).

The code converter 141 of the ALU 122 converts a logically inverted gray code !Dval_gc which is the complement of the gray code Dval_gc stored in the GC latch 121 into a binary code !Dval. Then, the full adder 142 adds the binary code !Dval and the binary code Pval stored in the temporary latch 123, logically inverts the addition result, and outputs the addition result as a binary code Dval−Pval (=!(!Dval+Pval)=!((−Dval+1)+Pval)=(−(−Dval+1)+Pval)+1)) of a pixel signal which is the difference between the P-phase pixel signal and the D-phase pixel signal and has been subjected to CDS to the IF latch 124 (D-phase latch transmission (CDS) in FIG. 11).

The difference between the P-phase pixel signal and the D-phase pixel signal is calculated by the above-mentioned process. Therefore, it is possible to calculate a pixel signal subjected to CDS.

<Operation Process of Column Counter>

Figure 12:
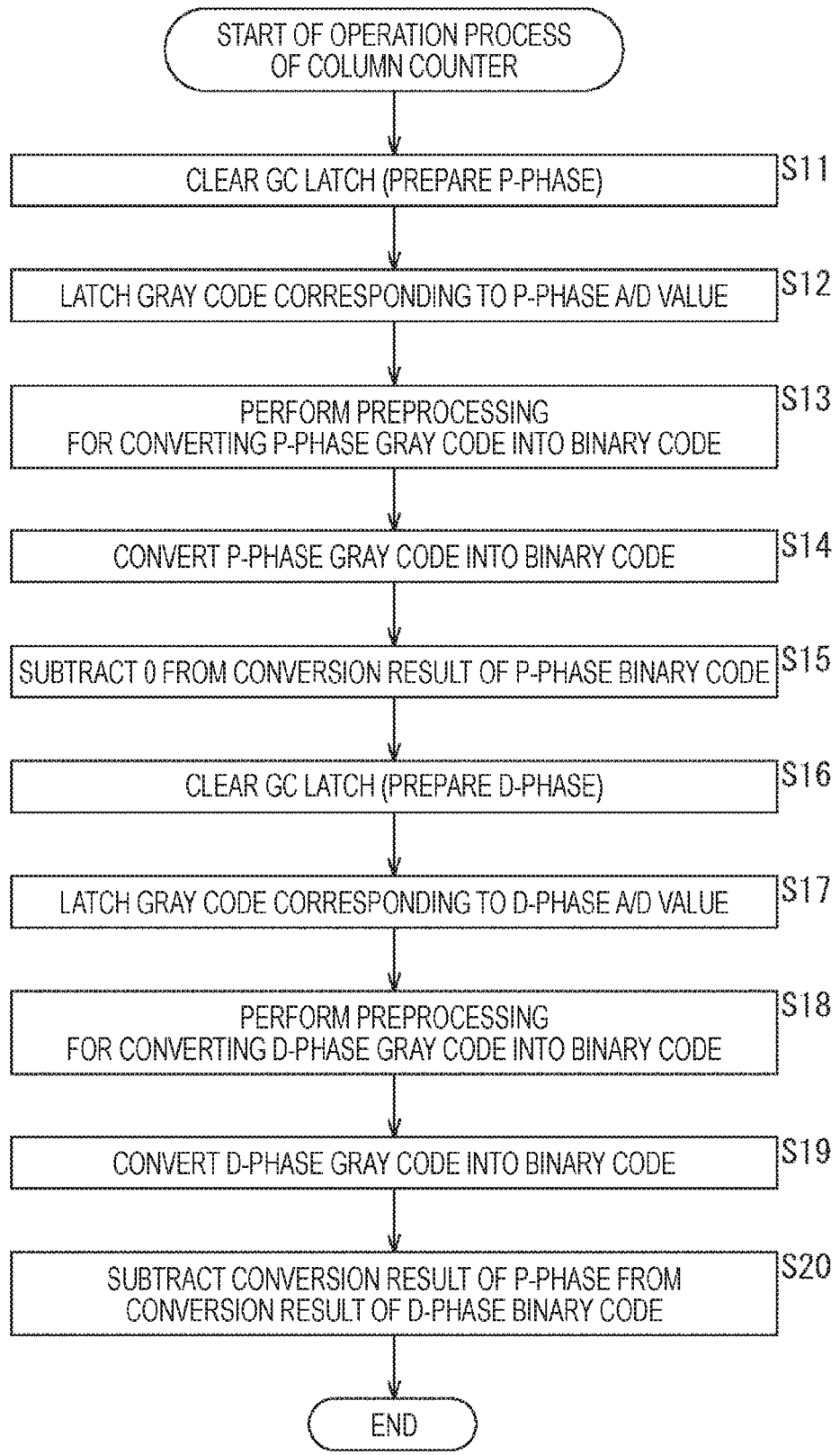
FIG. 12 is a flowchart illustrating an operation process of the column counter illustrated in FIG. 5.
Figure 13:
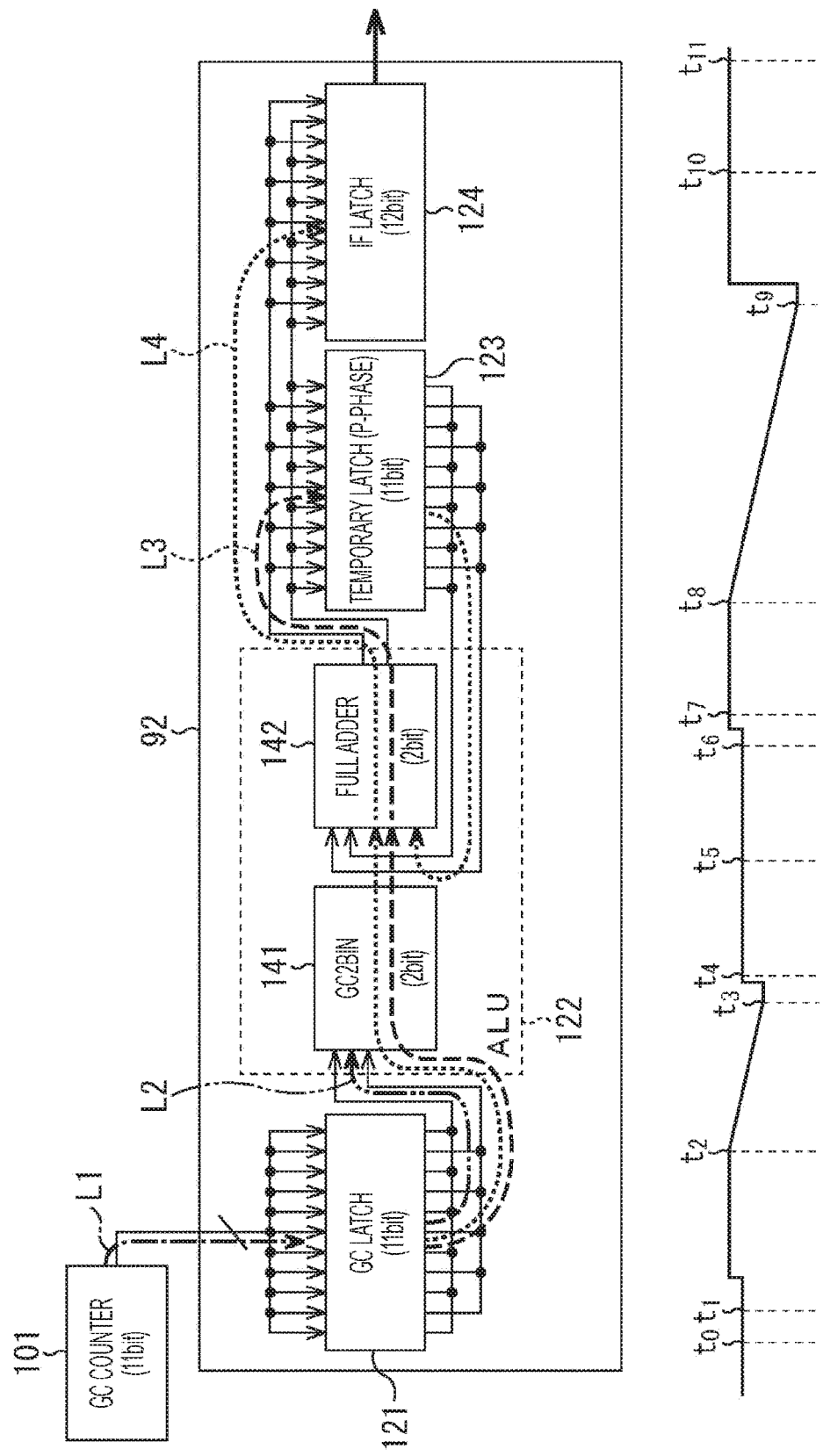
FIG. 13 is a diagram illustrating the operation process of the column counter illustrated in FIG. 5.

Next, a column counter operation process of the column counter 92 will be described with reference to FIGS. 12 and 13. In addition, FIG. 12 is a flowchart illustrating the operation process of the column counter. An upper part of FIG. 13 illustrates the configuration of the column counter 92. Data transfer between the components is represented by arrows in the upper part of FIG. 13. A lower part of FIG. 13 is a timing chart illustrating a ramp wave and a corresponding operation.

In step S11, the GC latch 121 is initialized and cleared. That is, preparation for receiving a gray code (GC) corresponding to a P-phase pixel signal is performed. For example, the process in step S11 is performed for a period from a time t0 to a time t1 in the waveform of the ramp wave illustrated in the lower part of FIG. 13.

In step S12, the GC latch 121 latches the gray code (GC) from the GC counter 72 as represented by a one-dot chain line L1 in the upper part of FIG. 13. For example, the process in step S12 is performed for a period from a time t2 to a time t3, for which the ramp wave is changed at a predetermined rate, in the waveform of the ramp wave illustrated in the lower part of FIG. 13. Specifically, at the time when the ramp wave is changed and the comparator 91 detects that the ramp wave is greater than the pixel signal, the gray code supplied from the GC counter 72 is latched as a gray code corresponding to the P-phase pixel signal.

In step S13, the code converter 141 of the ALU 122 performs the preprocessing in Processing Steps 1 to 10 in FIG. 7 to calculate the binary code BIN[0] corresponding to the least significant bit as represented by a two-dot chain line L2 in the upper part of FIG. 13. For example, the process in step S13 is performed for a period from a time t4 to a time t5 in the waveform of the ramp wave illustrated in the lower part of FIG. 13.

In step S14, the code converter 141 reads the gray code of the P-phase pixel signal latched in the GC latch 121, converts the gray code into a binary code, and outputs the binary code to the full adder 142 as represented by a dotted line L3 in the upper part of FIG. 13.

In step S15, the full adder 142 adds (subtracts) the binary code of the P-phase pixel signal and the binary code which is latched in the temporary latch 123 and in which all bits are 0 and latches the addition result in the temporary latch 123 as represented by the dotted line L3 in the upper part of FIG. 13. For example, the process in steps S14 and S15 is performed for a period from the time t5 to a time t6 in the waveform of the ramp wave illustrated in the lower part of FIG. 13.

In step S16, the GC latch 121 is initialized and cleared. That is, preparation for receiving a gray code (GC) corresponding to a D-phase pixel signal is performed. For example, the process in step S16 is performed for a period from a time t7 to a time t8 in the waveform of the ramp wave illustrated in the lower part of FIG. 13.

In step S17, the GC latch 121 latches the gray code (GC) from the GC counter 72 as represented by the one-dot chain line in the upper part of FIG. 13. For example, the process in step S17 is performed for a period from the time t8 to a time t9, for which the ramp wave is changed at a predetermined rate, in the waveform of the ramp wave illustrated in the lower part of FIG. 13. Specifically, at the time when the ramp wave is changed and the comparator 91 detects that the ramp wave is greater than the pixel signal, the gray code supplied from the GC counter 72 is latched as a gray code corresponding to the D-phase pixel signal.

In step S18, the code converter 141 of the ALU 122 performs the preprocessing in Processing Steps 1 to 10 in FIG. 7 to calculate the binary code BIN[0] corresponding to the least significant bit as represented by the two-dot chain line L2 in the upper part of FIG. 13. For example, the process in step S18 is performed for a period from the time t9 to a time t10 in the waveform of the ramp wave illustrated in the lower part of FIG. 13.

In step S19, the code converter 141 reads the gray code of the D-phase pixel signal latched in the GC latch 121, converts the gray code into a binary code, and outputs the binary code to the full adder 142 as represented by a dotted line L4 in the upper part of FIG. 13.

In step S20, the full adder 142 adds (subtracts) the binary code of the D-phase pixel signal and the binary code of the P-phase pixel signal which is latched in the temporary latch 123 and latches the addition result as a binary code of a pixel signal subjected to CDS in the IF latch 124 as represented by the dotted line L4 in the upper part of FIG. 13. For example, the process in steps S19 and S20 is performed for a period from the time t10 to a time t11 in the waveform of the ramp wave illustrated in the lower part of FIG. 13.

In the above-mentioned process, since the preprocessing in steps S13 and S18 is performed to calculate the binary code corresponding to the least significant bit, both the process in steps S14 and S15 and the process in steps S19 and S20 can sequentially calculate the high-order bits as described with reference to FIG. 7. Therefore, since each of the process in steps S14 and S15 and the process in steps S19 and S20 is continuously performed, for example, it is possible to increase the processing speed even in a process for every two bits as in the ALU 122 according to the present disclosure.

In addition, since it is possible to increase the processing speed even in the process for every two bits, it is possible to achieve a pixel array with a small number of wiring lines and to reduce the mounting area. Therefore, it is possible to respond to a pixel array with a narrow pitch. In addition, since a ripple counter or the like is not required, it is possible to reduce the mounting area and power consumption.

<Example of Configuration of GC Counter>

Next, an example of the configuration of the GC counter 72 will be described.

Figure 14:
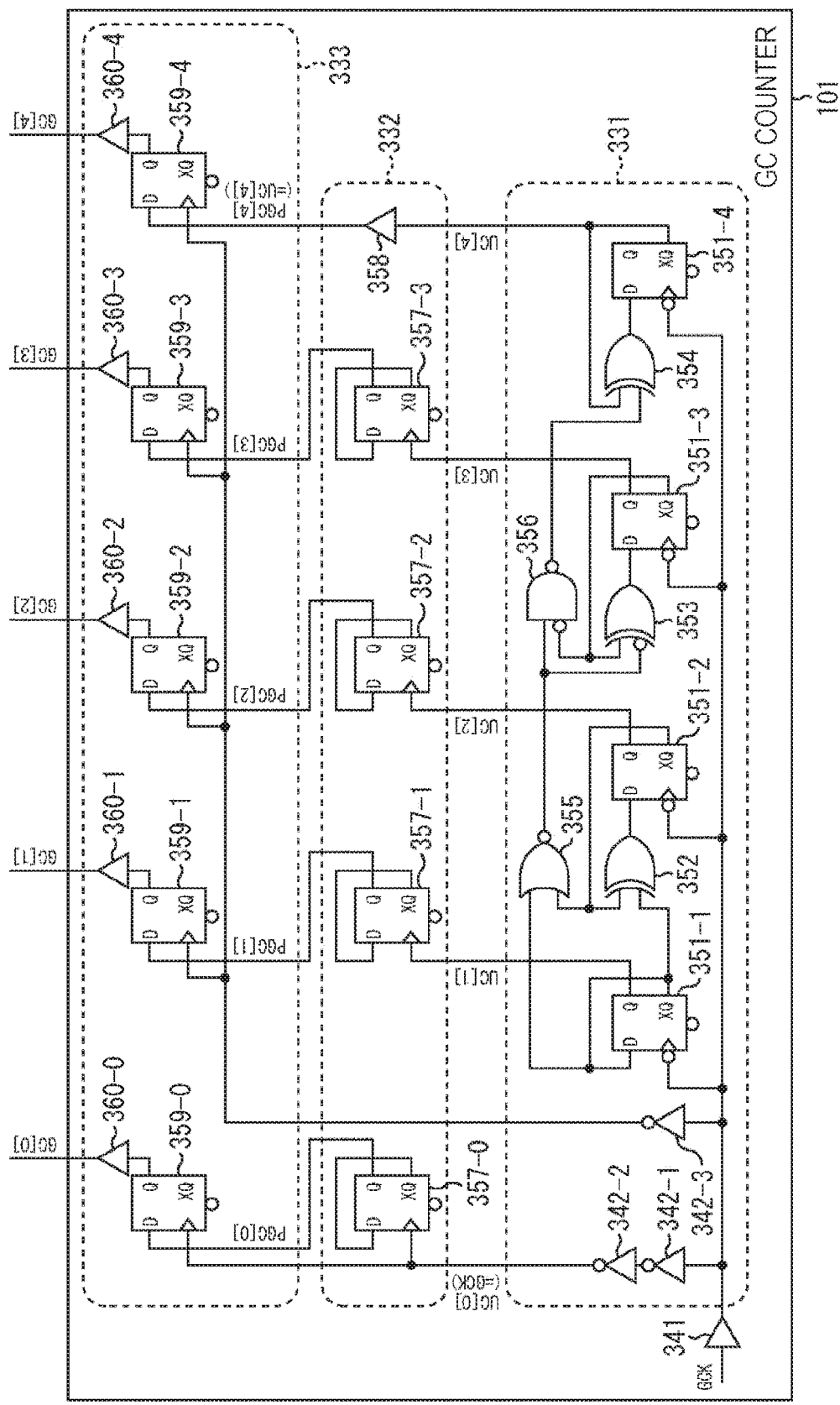
FIG. 14 is a diagram illustrating an example of the configuration of a GC counter including a binary counter and a code conversion unit.

The GC counter 72 can include, for example, a binary counter 331, a code conversion unit 332, and an output unit 333 as illustrated in FIG. 14.

The binary counter 331 generates binary codes UC[0] to UC[4] corresponding to 5 bits with respect to a clock signal GCK and outputs the binary codes to the code conversion unit 332.

The code conversion unit 332 converts the binary codes UC[0] to UC[4] corresponding to 5 bits supplied from the binary counter 331 into gray codes PGC[0] to PGC[4] corresponding to 5 bits and outputs the gray codes to the output unit 333.

The output unit 333 outputs the gray codes PGC[0] to PGC[4] corresponding to 5 bits from the code converter 302 as gray codes GC [0] to GC[4] according to an inverted signal of the clock signal GCK.

Specifically, the binary counter 331 includes a buffer 341, inverters 342-1 to 342-3, DFFs 351-1 to 351-4, XOR circuits 352 to 354, a NOR circuit 355, and a NAND circuit 356.

The binary code UC[0] is the clock signal GCK that is output through the buffer 341 and the inverters 342-1 and 342-2.

The inverted signal of the clock signal GCK is input to a clock terminal of the DFF 351-1 through the buffer 341. An inversion output terminal XQ of the DFF 351-1 is connected to a data terminal D. An output terminal Q of the DFF 351-1 is connected to a clock terminal of a DFF 357-1 of the code converter 332. With this configuration, an inverted signal of the currently held signal is input to the data terminal D of the DFF 351-1 whenever the clock signal GCK is input. Therefore, 1 and 0 (High and Low) are alternately output as the binary code UC[1] corresponding to the second bit from the output terminal Q. In addition, the DFF 351-1 outputs an inverted signal of the output signal from the output terminal Q to the XOR circuit 352 from the inversion output terminal XQ.

The XOR circuit 352 outputs 1 (High) to the data terminal D of the DFF 351-2 in a case where the input from the inversion output terminal XQ of the DFF 351-2 and the input from the inversion output terminal XQ of the DFF 351-1 are different from each other and outputs 0 (Low) to the data terminal D of the DFF 351-2 in a case where the inputs are equal to each other.

The DFF 351-2 holds the signal input to the data terminal D at the time when the clock terminal is High, outputs the held signal as the binary code UC[2] from the output terminal Q to a clock terminal of a DFF 357-2 of the code converter 332, and outputs an inverted signal of the held signal from the inversion output terminal XQ to the XOR circuit 352 and the NOR circuit 355.

The NOR circuit 355 outputs 0 (High) to the NAND circuit 356 and the XOR circuit 353 in a case where any of the output from the inversion output terminal XQ of the DFF 351-1 and the output from the inversion output terminal XQ of the DFF 351-2 is 1 (High) and outputs 1 (Low) to the NAND circuit 356 and the XOR circuit 353 in the other cases.

The XOR 353 outputs 0 (Low) to a data terminal D of the DFF 351-3 in a case where an inverted signal of the output of the NOR circuit 355 is the same as a signal from the inversion output terminal XQ of the DFF 351-3 on the basis of the inverted signal of the output of the NOR circuit 355 and the output signal from the inversion output terminal XQ of the DFF 351-3 and outputs 1 (High) to the data terminal D of the DFF 351-3 in the other cases.

The DFF 351-3 receives and holds the output of the XOR circuit 353 input to the data terminal D on the basis of an inverted signal of the clock signal GCL input to a clock terminal, outputs the held signal as the binary code UC[3] from an output terminal Q, and outputs an inverted signal of the held signal from the inversion output terminal XQ to the XOR circuit 353 and the NAND circuit 356.

The NAND circuit 356 outputs 1 (High) to the XOR 354 in a case where both the output of the NOR circuit 355 and the inverted signal from the inversion output terminal XQ of the DFF 351-3 are 1 (High) and outputs 0 (Low) to the XOR 354 in the other cases.

The XOR circuit 354 calculates the exclusive OR of the output of the NAND circuit 356 and the signal from the inversion output terminal XQ of the DFF 351-4 and inputs the calculation result to a data terminal D of the DFF 351-4.

The DFF 351-4 holds the signal output from the XOR circuit 354 on the basis of the inverted signal of the clock signal GCL, outputs the held signal from an output terminal Q, outputs an inverted signal of the held signal as the binary code UC[4] from an inversion output terminal XQ, and outputs the inverted signal to the XOR 354.

With this configuration, the binary counter 331 outputs the binary codes UC[0] to UC[4] corresponding to 5 bits to the code conversion unit 332 according to the clock signal GCK.

The code conversion unit 332 includes the DFFs 357-0 to 357-3 and a buffer 358.

The DFFs 357-0 to 357-3 receive the binary codes UC[0] to UC[3] through the clock terminals, respectively. In the DFFs 357-0 to 357-3, a data terminal D and an inversion output terminal XQ are connected to each other and a signal which is input to the data terminal D and is then held is output from an output terminal Q. The DFFs 357-0 to 357-3 output the inverted signals of the held signals as the gray codes PGC[0] to PGC[3] from the inversion output terminals XQ to the output unit 333, respectively. The buffer 358 outputs the binary code UC[4] which is the most significant bit as the gray code PGC[4] to the output unit 333 without any change.

With this configuration, the code converter 332 converts the binary codes UC[0] to UC[4] into the gray codes PGC[0] to PGC[4] and outputs the gray codes PGC[0] to PGC[4] to the output unit 333.

The output unit 333 includes DFFs 359-0 to 359-4 and buffers 360-0 to 360-4. The DFFs 359-0 to 359-4 receive the inverted signal of the clock signal GCK through clock terminals, receive the gray codes PGC [0] to PGC [4] corresponding to each bit through data terminals D, and hold the gray codes PGC [0] to PGC [4] in correspondence with the clock signal GCK, respectively. The DFFs 359-0 to 359-4 output the held signals as the gray codes GC [0] to PGC [4] from output terminals Q to the buffers 360-1 to 360-4, respectively.

With this configuration, the gray code counter 101 sequentially outputs the gray codes GC[0] to GC[4] corresponding to 5 bits according to the clock GCK.

<Increase in Bits of GC Counter>

However, in a case where the bits of the GC counter 72 are increased, it is necessary to increase the bits of the above-described binary counter 331.

Figure 15:
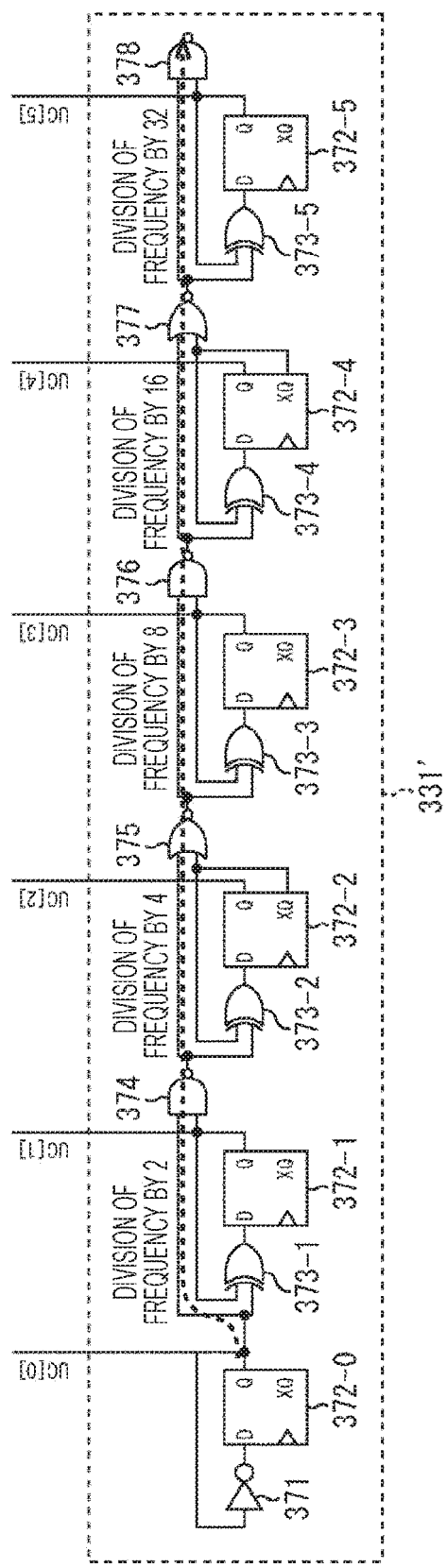
FIG. 15 is a diagram illustrating an example of the configuration of a binary counter in a case where the number of bits of a binary code is increased in order to increase the number of bits of a gray code.

With respect to the binary counter 331 illustrated in FIG. 14 that outputs binary codes corresponding to 5 bits, a binary counter that outputs binary codes corresponding to six bits has, for example, a configuration illustrated in FIG. 15. That is, a binary counter 331' illustrated in FIG. 15 includes an inverter 371, DFFs 372-0 to 372-5, XOR circuits 373-1 to 373-5, NAND circuits 374, 376, and 378, and NOR circuits 375 and 377.

In the binary counter 331' illustrated in FIG. 15, binary codes UC[0] to UC[5] are output from output terminals Q of the DFFs 372-0 to 372-5.

However, as illustrated in FIG. 15, as the number of DFFs 372 becomes larger, the setup time becomes longer. Here, the setup time is a period from the time when the DFF 372-0 operates to the time when the operation of other adjacent DFFs 372-1 to DFF 372-5 or the like starts in a case where the DFFs 372-0 to 372-5 are connected in series to each other as illustrated in FIG. 15.

That is, in the case of FIG. 15, the frequency division ratio of the DFF 372-2 is 2 with respect to the setup time of the DFF 372-1. Similarly, the frequency division ratios of the DFFs 372-3 to 372-5 are 4, 8, 16, and 32, respectively. That is, the number of DFFs 372 forming the binary counter 331' becomes larger as the number of bits in the binary counter becomes larger. As the number of DFFs 372 becomes larger, the setup time becomes longer.

Therefore, a method is considered which performs retiming on a data transmission path to reduce the setup time.

Figure 16:
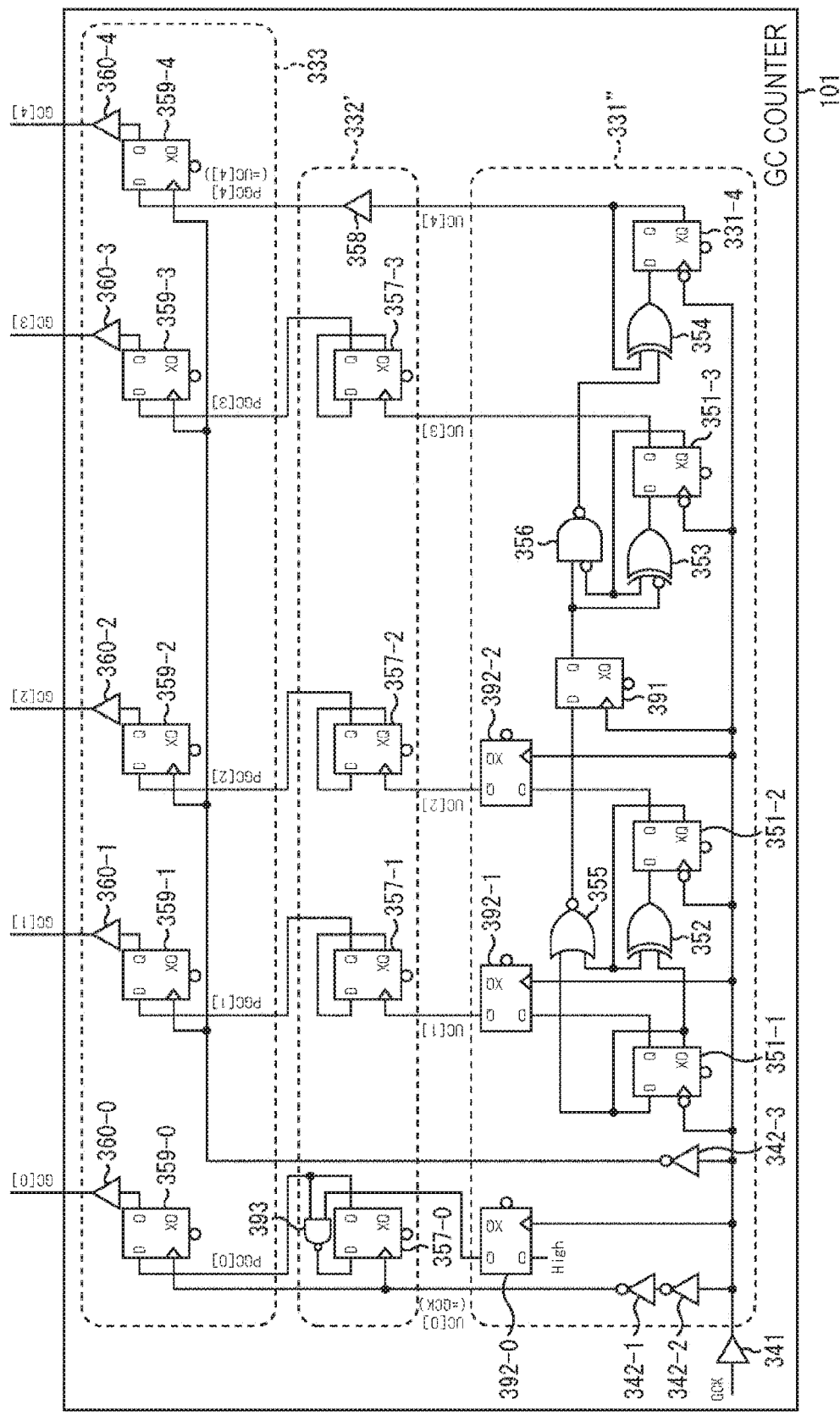
FIG. 16 is a diagram illustrating an example of the configuration of a gray code counter in a case where the number of bits of a gray code is increased.

For example, as illustrated in FIG. 16, a DFF 391 for retiming is provided between the NOR circuit 355, and the XOR circuit 353 and the NAND circuit 356 in the GC counter 72 illustrated in FIG. 14. The DFF 391 has a data terminal D that is connected to the output of the NOR circuit 355 and an output terminal Q that is connected to the XOR circuit 353 and the NAND circuit 356. In addition, a clock terminal of the DFF 391 receives the clock signal GCK.

With this configuration, the DFF 391 directly receives the clock signal GCK and outputs the clock signal GCK to the XOR circuit 353 and the NAND circuit 356. Therefore, it is possible to perform retiming without being affected by the output timing of the DFFs 351-0 to 331-2 and thus to reduce the setup time.

However, in the case of FIG. 16, delay occurs due to the operation of the DFF 391. Therefore, DFFs 392-0 to 392-2 and a NAND circuit 393 for delay measures are required in order to equalize the latencies of low-order bits.

Figure 17:
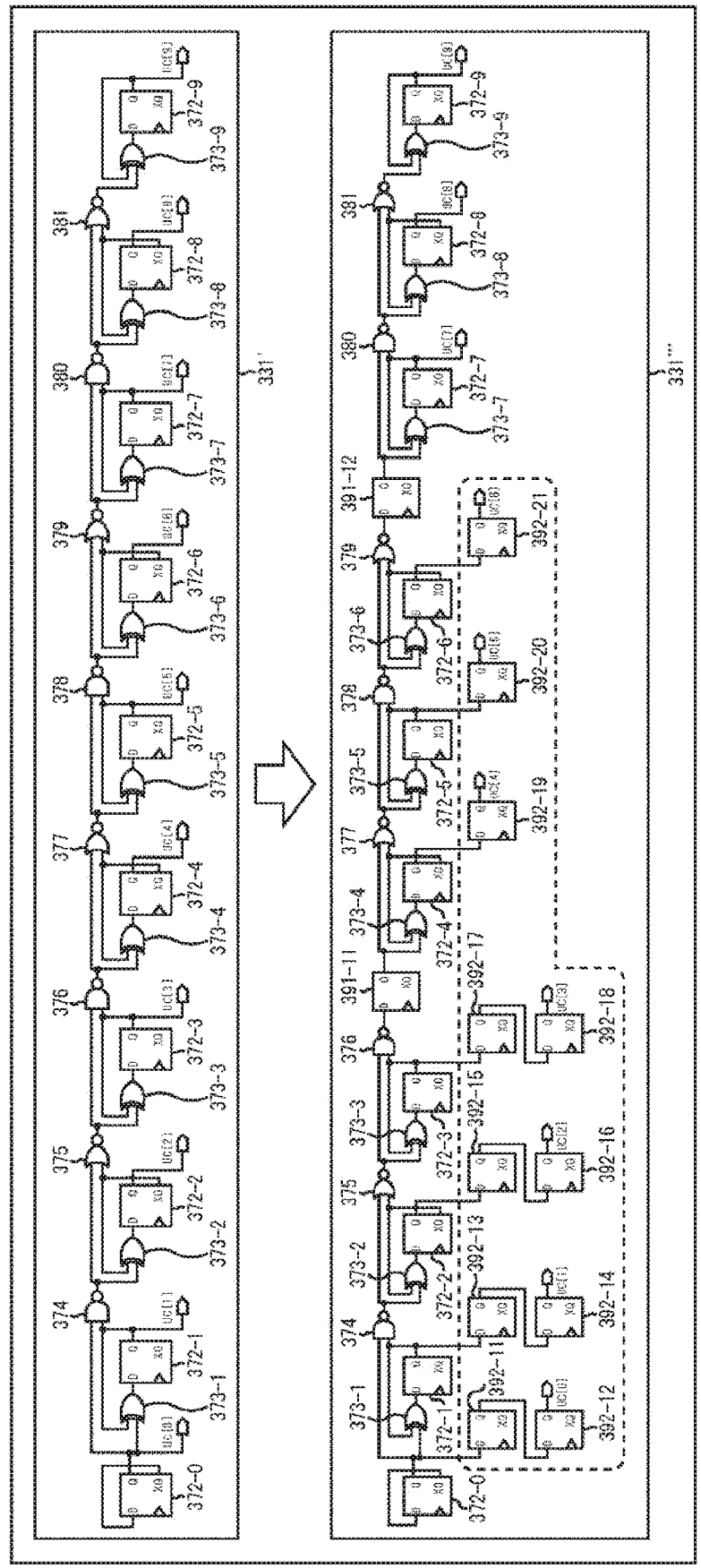
FIG. 17 is a diagram illustrating an example of the configuration of a binary code counter in a case where the configuration of the gray code counter illustrated in FIG. 16 is applied to increase the number of bits of the binary code counter.

Similarly, as illustrated in an upper part of FIG. 17, a binary counter 331' is considered which includes XOR circuits 371-1 to 371-9, DFFs 372-0 to 372-9, NAND circuits 374, 376, 378, and 380, and NOR circuits 375, 377, 379, and 381 and outputs binary codes UC[0] to UC[9] corresponding to 10 bits.

In this case, as illustrated in a lower part of FIG. 17, DFFs 391-11 and 391-12 for retiming are provided in the binary counter 331' illustrated in the upper part of FIG. 17.

Specifically, in the case of the lower part of FIG. 17, the DFF 391-11 for retiming is provided between the NAND circuit 376, and the NOR circuit 377 and the XOR circuit 373-4. Similarly, the DFF 391-12 for retiming is provided between the NOR circuit 379, and the NAND circuit 380 and the XOR circuit 373-7.

This configuration makes it possible for each of the DFFs 391-11 and 391-12 to perform retiming. Therefore, it is possible to reduce the setup time of the binary counter 331' illustrated in FIG. 17.

However, as illustrated in the lower part of FIG. 17, DFFs 392-11 to 392-20 which are used to adjust delay caused by the operation of the DFFs 391-11 and 391-12 for retiming and are surrounded by a dotted line are required in order to output low-order bits. In particular, for low-order bits in a stage before the DFF 391-11, it is necessary to absorb the delay of both the DFFs 391-11 and 391-12. Therefore, two DFFs 392 are required for each bit in order to adjust the delay of each of the DFFs 391-11 and 391-12.

In any case, as a result, as the number of bits of the binary counter becomes larger, the number of DFFs 392 becomes larger, which results in an increase in the mounting area and power consumption.

<Example of Configuration of GC Counter According to the Present Disclosure>

Figure 18:
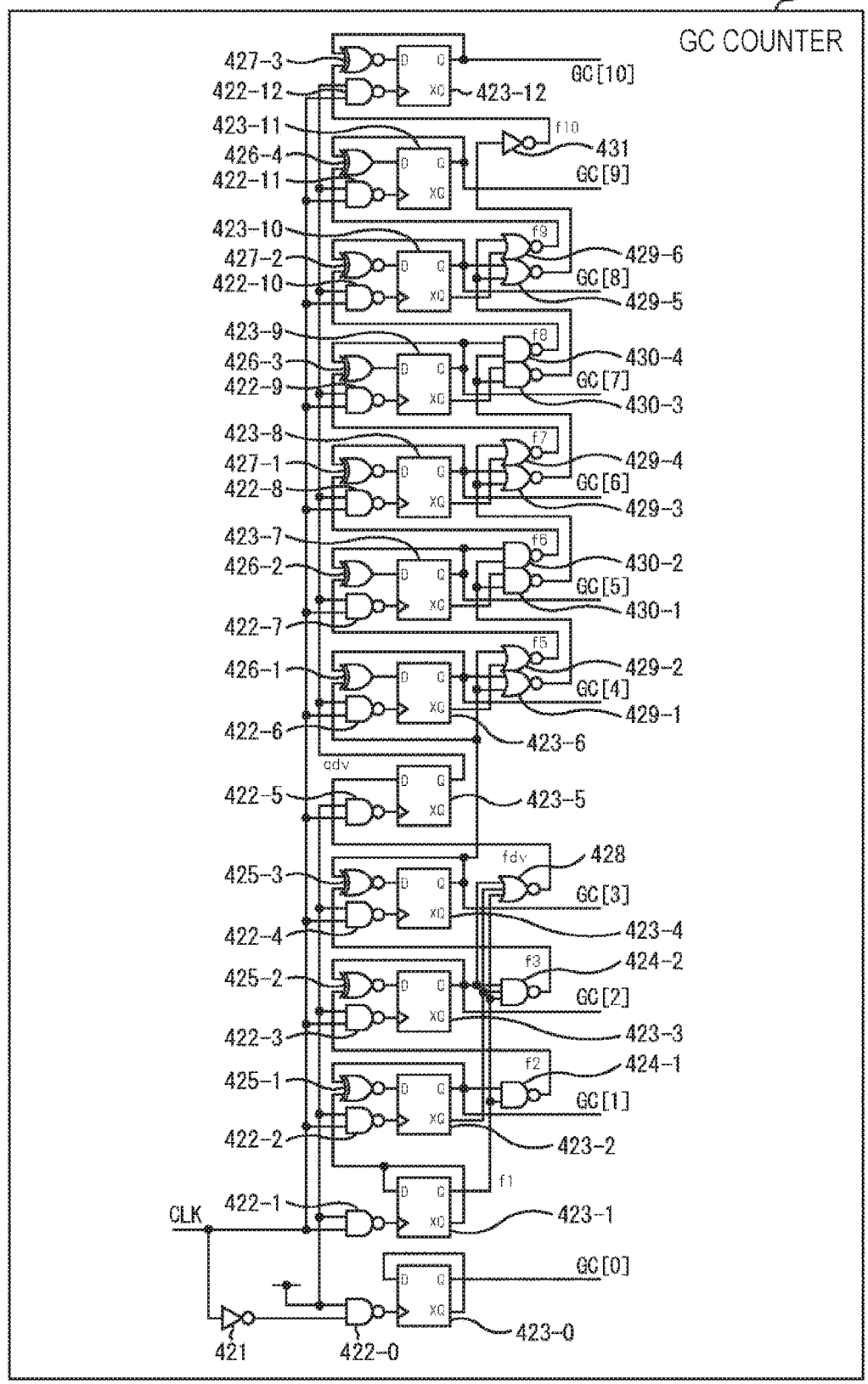
FIG. 18 is a diagram illustrating an example of the configuration of a gray code counter according to the present disclosure.

Therefore, for example, the GC counter 72 according to the present disclosure may be configured as illustrated in FIG. 18 in order to reduce the mounting area and the setup time.

The GC counter 72 illustrated in FIG. 18 includes an inverter 421, NAND circuits 422-0 to 422-12, DFFs 423-0 to 423-12, NAND circuits 424-1 and 424-2, XNOR circuits 425-1 to 425-3, XOR circuits 426-1 to 426-4, XNOR circuits 427-1 to 427-3, a NOR circuit 428, NOR circuits 429-1 to 429-6, NAND circuits 430-1 to 430-4, and an inverter 431.

The inverter 421 generates an inverted signal of the clock signal CLK and outputs the inverted signal to an input terminal of the NAND circuit 422-0.

The NAND circuit 422-0 calculates the NAND of the inverted signal of the clock signal CLK and a Hi signal and outputs the calculation result to a clock terminal of the DFF 423-0.

The DFF 423-0 has a data terminal D and an inversion output terminal XQ which are connected to each other, operates according to a signal input to the clock terminal from the NAND circuit 422-0, and outputs a gray code GC[0] from an output terminal Q.

The NAND circuits 422-1 to 422-5 calculate the NAND of the input clock signal CLK and the Hi signal and output the calculation results to the clock terminals of the DFFs 423-0 to 423-5, respectively.

A data terminal D and an inversion output terminal XQ of the DFF 423-1 and an input terminal of the XNOR 425-1 are connected to each other. The DFF 423-1 operates according to a signal input to a clock terminal from the NAND circuit 422-1 and outputs a signal f1 from an output terminal Q to input terminals of the NAND circuits 424-1 and 424-2 and the NOR circuit 428.

The DFF 423-2 has a data terminal D that is connected to an output terminal of the XNOR circuit 425-1, an output terminal Q that is connected to the input terminals of the XNOR circuit 425-1 and the NAND circuit 424-1, and outputs a gray code GC[1] from the output terminal Q. In addition, an inversion output terminal XQ of the DFF 423-2 and the input terminals of the NAND circuit 424-2 and the NOR circuit 428 are connected to each other.

The XNOR 425-1 calculates the XNOR of the signal from the inversion output terminal XQ of the DFF 423-1 and the signal from the output terminal Q of the DFF 423-2 and outputs the calculation result to the data terminal D of the DFF 423-2.

The NAND circuit 424-1 calculates the NAND of the output terminals Q of the DFFs 423-1 and 423-2 and outputs the calculation result as a signal f2 to an input terminal of the XNOR 425-2.

The DFF 423-3 has a data terminal D that is connected to an output terminal of the XNOR circuit 425-2 and an output terminal Q that is connected to the input terminals of the XNOR circuit 425-2, the NAND circuit 424-2, and the NOR circuit 428 and outputs a gray code GC[2] from the output terminal Q.

The XNOR 425-2 calculates the XNOR of the signal from the output terminal Q of the DFF 423-3 and the signal f2 and outputs the calculation result to the data terminal D of the DFF 423-3.

The NAND circuit 424-2 calculates the NAND of the output terminals Q of the DFFs 423-1 and 423-3 and the inversion output terminal XQ of the DFF 423-2 and outputs the calculation result as a signal f3 to an input terminal of the XNOR 425-3.

The DFF 423-4 has a data terminal D that is connected to an output terminal of the XNOR circuit 425-3 and an output terminal Q that is connected to the input terminals of the XNOR circuit 425-3, the NOR circuits 429-1 and 429-2, and the XOR circuit 426-1 and outputs a gray code GC[3] from the output terminal Q.

The XOR 428 calculates the NOR of the signals from the output terminals Q of the DFFs 423-1 and 423-3 and the signal from the inversion output terminal XQ of the DFF 423-2 and outputs the calculation result as a signal fdv to a data terminal D of the DFF 423-5.

The signal fdv is input to the data terminal D of the DFF 423-5 and the DFF 423-5 outputs a signal qdv from an output terminal Q to the input terminals of the NAND circuits 422-6 to 422-12 on the basis of the signal supplied to a clock terminal from the NAND circuit 422-5.

The NAND circuits 422-6 to 422-12 calculate the NAND of the signal qdv and the clock signal CLK and input the calculation result to clock terminals of the DFFs 423-6 to 423-12, respectively.

The DFF 423-6 has an output terminal Q that is connected to the input terminals of the XOR circuit 426-1 and the NOR circuit 429-1 and outputs a gray code GC[4] from the output terminal Q. The DFF 423-6 has an inversion output terminal XQ that is connected to the input terminal of the NOR circuit 429-2. The XOR circuit 426-1 calculates the XOR of the gray code GC[4] which is a signal from the output terminal Q of the DFF 423-6 and the gray code GC[3] which is a signal from the output terminal Q of the DFF 423-4 and outputs the calculation result to a data terminal D of the DFF 423-6.

The NOR circuit 429-1 calculates the NOR of the gray code GC[4] which is the signal from the output terminal Q of the DFF 423-6 and the gray code GC[3] which is the signal from the output terminal Q of the DFF 423-4 and outputs the calculation result to the input terminals of the NAND circuits 430-1 and 430-2.

The NOR circuit 429-2 calculates the NOR of the signal from the inversion output terminal XQ of the DFF 423-6 and the gray code GC[3] which is the signal from the output terminal Q of the DFF 423-4 and outputs the calculation result as a signal f5 to an input terminal of the XOR circuit 426-2.

The DFF 423-7 has an output terminal Q that is connected to the input terminals of the XOR circuit 426-2 and the NAND circuit 430-2 and outputs a gray code GC[5] from the output terminal Q. The DFF 423-7 has an inversion output terminal XQ that is connected to an input terminal of the NAND circuit 430-1. The XOR circuit 426-2 calculates the XOR of the gray code GC[5] which is a signal from the output terminal Q of the DFF 423-7 and the signal f5 and outputs the calculation result to a data terminal D of the DFF 423-7.

The NAND circuit 430-1 calculates the NAND of the output signal of the NOR circuit 429-1 and the signal from the inversion output terminal XQ of the DFF 423-7 and outputs the calculation result to the input terminals of the NOR circuits 429-3 and 429-4.

The NAND circuit 430-2 calculates the NOR of the output signal of the NOR circuit 429-1 and the gray code GC[5] which is the signal from the output terminal Q of the DFF 423-7 and outputs the calculation result as a signal f6 to an input terminal of the XNOR 427-1.

The DFF 423-8 has an output terminal Q that is connected to the input terminals of the XNOR circuit 427-1 and the NOR circuit 429-3 and outputs a gray code GC[6] from the output terminal Q. The DFF 423-8 has an inversion output terminal XQ that is connected to an input terminal of the NOR circuit 429-4. The XNOR circuit 427-1 calculates the XNOR of the gray code GC[6] which is a signal from the output terminal Q of the DFF 423-8 and the signal f6 and outputs the calculation result to a data terminal D of the DFF 423-8.

The NOR circuit 429-3 calculates the NOR of the gray code GC[6] which is the signal from the output terminal Q of the DFF 423-8 and the output signal of the NAND circuit 430-1 and outputs the calculation result to the input terminals of the NAND circuits 430-3 and 430-4.

The NOR circuit 429-4 calculates the NOR of the signal from the inversion output terminal XQ of the DFF 423-8 and the output signal of the NAND circuit 430-1 and outputs the calculation result as a signal f7 to an input terminal of the XOR 426-3.

The DFF 423-9 has an output terminal Q that is connected to the input terminals of the XOR circuit 426-3 and the NAND circuit 430-4 and outputs a gray code GC[7] from the output terminal Q. The DFF 423-9 has an inversion output terminal XQ that is connected to an input terminal of the NAND circuit 430-3. The XOR circuit 426-3 calculates the XOR of the gray code GC[7] which is a signal from the output terminal Q of the DFF 423-9 and the signal f7 and outputs the calculation result to a data terminal D of the DFF 423-9.

The NAND circuit 430-3 calculates the NAND of the output signal of the NOR circuit 429-3 and the signal from the inversion output terminal XQ of the DFF 423-9 and outputs the calculation result to the input terminals of the NOR circuits 429-5 and 429-6.

The NAND circuit 430-4 calculates the NAND of the output signal of the NOR circuit 429-3 and the gray code GC[7] which is the signal from the output terminal Q of the DFF 423-9 and outputs the calculation result as a signal f8 to an input terminal of the XNOR 427-2.

The DFF 423-10 has an output terminal Q that is connected to the input terminals of the XNOR circuit 427-2 and the NOR circuit 429-5 and outputs a gray code GC[8] from the output terminal Q. The DFF 423-10 has an inversion output terminal XQ that is connected to an input terminal of the NOR circuit 429-6. The XNOR circuit 427-2 calculates the XNOR of the gray code GC[8] which is a signal from the output terminal Q of the DFF 423-10 and the signal f8 and outputs the calculation result to a data terminal D of the DFF 423-10.

The NOR circuit 429-5 calculates the NOR of the gray code GC[8] which is the signal from the output terminal Q of the DFF 423-10 and the output signal of the NAND circuit 430-3 and outputs the calculation result to an input terminal of the inverter 431.

The NOR circuit 429-6 calculates the NOR of the signal from the inversion output terminal XQ of the DFF 423-10 and the output signal of the NAND circuit 430-3 and outputs the calculation result as a signal f9 to an input terminal of the XOR 426-4.

The DFF 423-11 has an output terminal Q that is connected to an input terminal of the XOR circuit 426-4 and outputs a gray code GC[9] from the output terminal Q. The XOR circuit 426-4 calculates the XOR of the gray code GC[9] which is a signal from the output terminal Q of the DFF 423-11 and the signal f9 and outputs the calculation result to a data terminal D of the DFF 423-11.

The inverter 431 inverts the output signal of the NOR circuit 429-5 and outputs the inverted signal as a signal f10 to an input terminal of the XNOR circuit 427-3.

The DFF 423-12 has an output terminal Q that is connected to an input terminal of the XNOR circuit 427-3 and outputs a gray code GC[10] from the output terminal Q. The XNOR circuit 427-3 calculates the XNOR of the gray code GC[10] which is a signal from the output terminal Q of the DFF 423-12 and the signal f10 and outputs the calculation result to a data terminal D of the DFF 423-12.

This configuration makes it unnecessary to separately configure, for example, a binary counter and a code converter and makes it possible to configure them with two DFFs in addition to the number of bits of the gray code.

Therefore, it is possible to reduce the number of DFFs and the mounting area. In addition, it is possible to reduce power consumption.

Figure 19:
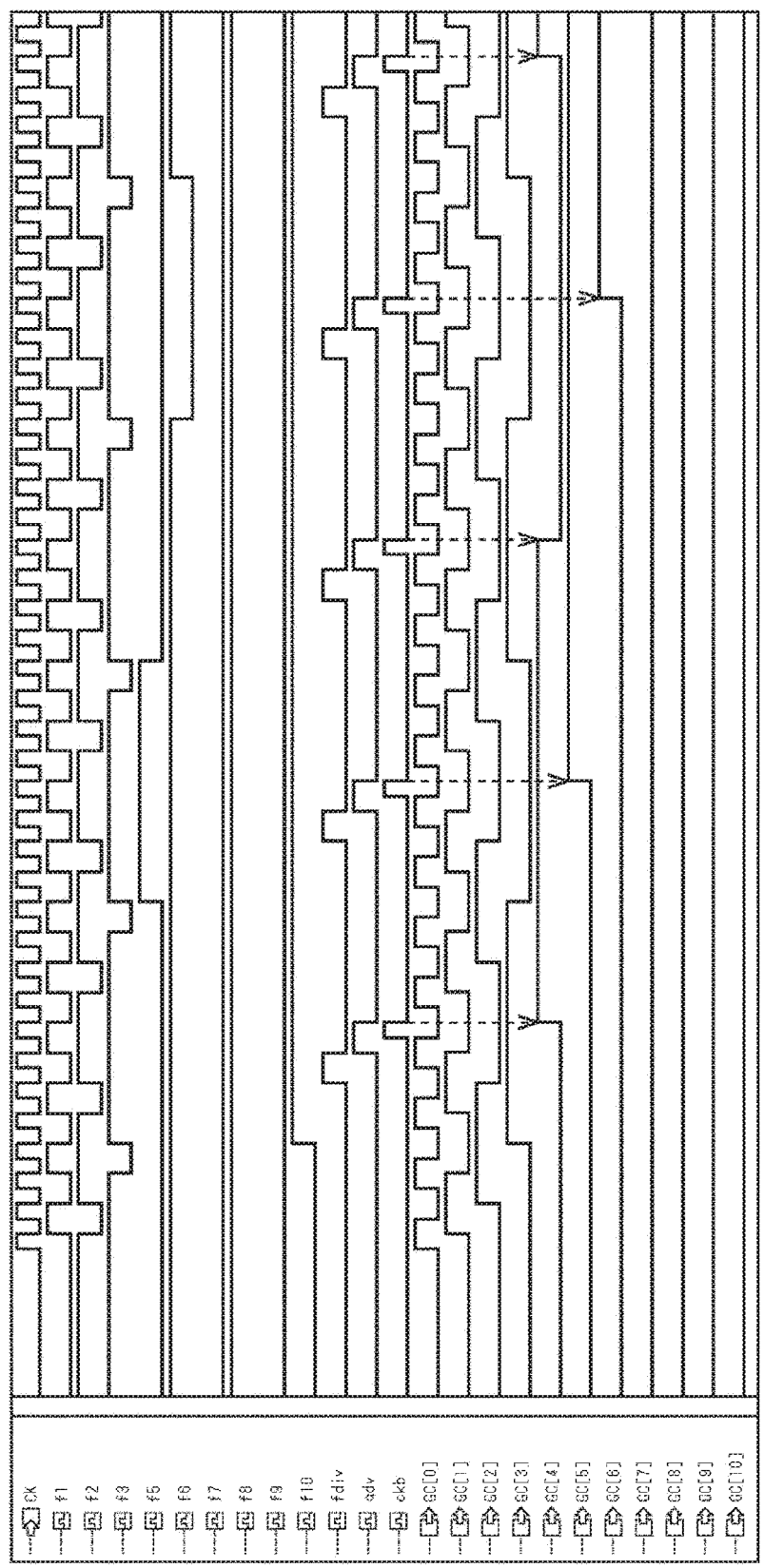
FIG. 19 is a waveform diagram illustrating a gray code generated by the gray code counter illustrated in FIG. 18.

In addition, this configuration makes it possible for the GC counter 72 illustrated in FIG. 18 to generate the gray codes GC[0] to GC[10] represented by waveforms illustrated in FIG. 19.

Note that FIG. 19 illustrates the waveforms of the clock signal CLK, the signals f1 to f10, the signal fdv, the signal qdv, signals ckb (signals output from the NAND circuits 422-5 to 422-12), and the gray codes GC[0] to GC[10] from the upper side.

That is, in the GC counter 72 illustrated in FIG. 18, the gray codes GC[1] to [3] are directly decoded so as to correspond to a gray code pattern.

In addition, each of the gray codes GC[4] to GC[10] may be inverted at the point where the value of the previous bit is High and the value of a bit before the previous bit is Low. Each of the gray codes GC[4] to GC[10] propagates serially at the time when it is at a Low level and a logical value between the current bit and the previous bit is calculated to generate an inverted signal.

With this configuration, serial propagation is delayed, but the setup time can be ensured by a thinning clock.

In a case where the gray codes GC[4] to GC[10] are generated from the outputs of the gray codes GC[1] to GC[3], the provision of the DFF 423-5 makes it possible to generate the signal qdv masking the clock signal CLK, as indicated by a dotted arrow in FIG. 19. Therefore, it is possible to operate the DFFs 422-5 to 422-12 with a clock signal obtained by dividing the frequency of the clock signal CLK by 8.

This configuration makes it possible to reduce the setup time and power consumption.

Note that the example in which the number of bits of the gray code is 10 has been described above. However, other numbers of bits may be used. In addition, the example in which the gray codes GC[1] to GC[3] are directly decoded as a gray code pattern and the other gray codes GC[4] to GC[10] are generated on the basis of the thinning clock has been described above. However, the number of bits that are directly decoded and the number of bits generated on the basis of the thinning clock may be combined by methods other than the above.

<Examples of Application to Electronic Apparatuses>

The imaging element 11 can be applied to various electronic apparatuses including imaging apparatuses, such as digital still cameras and digital video cameras, mobile phones having an imaging function, and other apparatuses having an imaging function.

Figure 20:
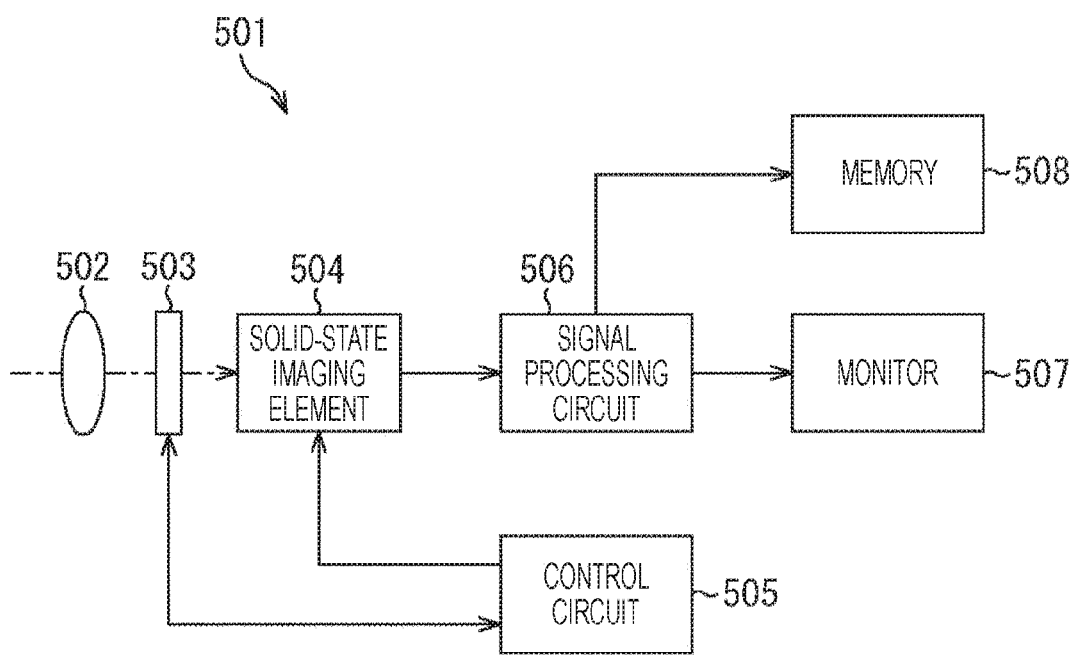
FIG. 20 is a block diagram illustrating an example of the configuration of an imaging apparatus as an electronic apparatus to which a camera module according to the present disclosure is applied.

FIG. 20 is a block diagram illustrating an example of the configuration of an imaging apparatus as an electronic apparatus to which the present technology is applied.

An imaging apparatus 501 illustrated in FIG. 20 includes an optical system 502, a shutter device 503, a solid-state imaging element 504, a driving circuit 505, a signal processing circuit 506, a monitor 507, and a memory 508 and can capture still images and moving images.

The optical system 502 includes one lens or a plurality of lenses, guides light (incident light) from an object to the solid-state imaging element 504 such that the light is focused on a light receiving surface of the solid-state imaging element 504.

The shutter device 503 is provided between the optical system 502 and the solid-state imaging element 504 and controls a period for which light is emitted to the solid-state imaging element 504 and a light shielding period under the control of the driving circuit 505.

The solid-state imaging element 504 is a package including the above-mentioned solid-state imaging element. The solid-state imaging element 504 accumulates signal charge for a predetermined period according to light focused on the light receiving surface through the optical system 502 and the shutter device 503. The signal charge accumulated in the solid-state imaging element 504 is transmitted according to a driving signal (timing signal) supplied from the driving circuit 505.

The driving circuit 505 outputs driving signals for controlling a transmission operation of the solid-state imaging element 504 and a shutter operation of the shutter device 503 to drive the solid-state imaging element 504 and the shutter device 503.

The signal processing circuit 506 performs various types of signal processing for the signal charge output from the solid-state imaging element 504. An image (image data) obtained by the signal processing of the signal processing circuit 506 is supplied to the monitor 507 and is then displayed on the monitor 507 or is supplied to the memory 508 and is then stored (recorded) in the memory 508.

In the imaging apparatus 501 having this configuration, the imaging element 11 may be applied instead of the optical system 502, the shutter device 503, and the solid-state imaging element 504. In this case, it is possible to reduce power consumption while reducing the mounting area.

<Usage Examples of Imaging Element>

Figure 21:
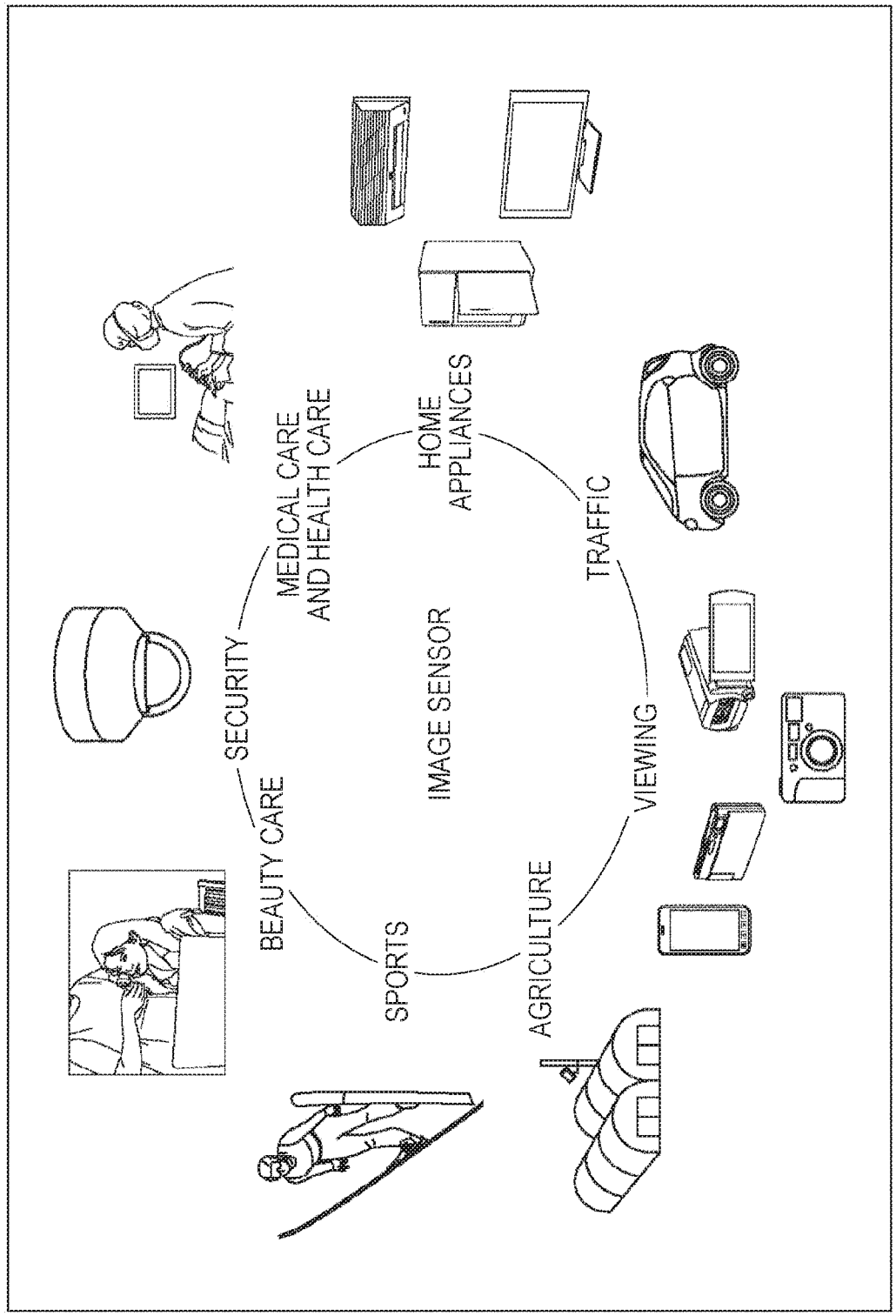
FIG. 21 is a diagram illustrating a usage example of the camera module to which the technology according to the present disclosure is applied.

FIG. 21 is a diagram illustrating examples of using the above-described imaging element 11.

The above-described camera module can be used in various cases in which light, such as visible light, infrared light, ultraviolet light, or X-rays, is sensed as described below, for example.

- Apparatuses that capture images for viewing, such as digital cameras and portable apparatuses with a camera function
- Apparatuses used for traffic, such as in-vehicle sensors that capture the images of the front, back, periphery, inside, and the like of a car for safe driving including automatic stop or the like or for recognition of the condition of the driver, for example, monitoring cameras for monitoring a traveling vehicle or a road, and distance measurement sensors that measure the distance between vehicles, for example
- Apparatuses used for home appliances, such as TVs, refrigerators, and air conditioners, in order to capture the gesture of a user and to operate the appliances operation according to the gesture
- Apparatuses used for medical care or health care, such as endoscopes or apparatuses that receive infrared light to capture the image of blood vessels
- Apparatuses used for security, such as surveillance cameras for security and cameras for person authentication
- Apparatuses used for beauty care, such as skin measurement apparatuses for capturing the image of the skin and microscopes for capturing the image of the skin of the scalp
- Apparatuses used for sports, such as action cameras and wearable cameras for sports or the like
- Apparatuses used for agriculture, such as cameras for monitoring the condition of fields and crops Note that the present disclosure can also have the following configurations.

<1> An imaging element includes: an imaging unit that includes a plurality of pixels and captures an image; a gray code latch that latches a gray code corresponding to a pixel signal of the pixel; a conversion unit that converts the gray code latched in the gray code latch into a binary code; a temporary latch that temporarily latches a predetermined binary code; and a calculation unit that calculates a difference between the binary code converted from the gray code by the conversion unit and the predetermined binary code latched in the temporary latch. After the conversion unit converts the gray code into the binary code, the calculation unit continuously calculates a difference between a binary code corresponding to the same bit converted by the conversion unit and the predetermined binary code latched in the temporary latch.

<2> In the imaging element according to <1>, the conversion unit calculates the binary code corresponding to a least significant bit first and sequentially converts the gray code corresponding to a high-order bit into the binary code using the binary code corresponding to the least significant bit.

<3> In the imaging element according to <2>, the conversion unit calculates an exclusive OR of all bits latched in the gray code latch as the gray corresponding to the least significant bit.

<4> In the imaging element according to any one of <1> to <3>, the conversion unit converts the gray code latched in the gray code latch into the binary code in units of a plurality of bits. After the conversion unit converts the gray code into the binary code, the calculation unit continuously calculates a difference between the binary code corresponding to the same bit converted by the conversion unit and the predetermined binary code latched in the temporary latch in the units of the plurality of bits.

<5> In the imaging element according to any one of <1> to <4>, the temporary latch latches a binary code in which all bits are 0 as the predetermined binary code. The calculation unit calculates a binary code formed by a difference between the binary code converted from the gray code of a P-phase pixel signal which is the pixel signal in a state in which the pixels are initialized and the binary code in which all bits are 0 and which is latched in the temporary latch as a binary code of the P-phase pixel signal and latches the calculated binary code in the temporary latch.

<6> In the imaging element according to <5>, the calculation unit outputs a difference between the binary code converted from the gray code of a D-phase pixel signal which is the pixel signal corresponding to an amount of light received by the pixels and the binary code of the P-phase pixel signal latched in the temporary latch as a binary code of a pixel signal subjected to correlated double sampling (CDS).

<7> In the imaging element according to any one of <1> to <6>, the conversion unit converts a complement number of the gray code latched in the gray code latch into a binary code and the calculation unit calculates a difference between the binary code which is a conversion result of the conversion unit and the predetermined binary code latched in the temporary latch and outputs a complement number of the difference.

<8> The imaging element according to any one of <1> to <7> further includes a gray code counter that sequentially generates the gray code. The gray code counter includes: a low-order gray code generation unit that generates a gray code lower than a predetermined bit among gray codes corresponding to a predetermined number of bits on the basis of a clock signal; a high-order gray code generation unit that generates a gray code higher than a predetermined bit among the gray codes corresponding to the predetermined number of bits on the basis of the clock signal; and a frequency-divided clock signal generation unit that generates a frequency-divided clock signal obtained by dividing a frequency of the clock signal by a predetermined number on the basis of a gray code corresponding to the low-order bit. The high-order gray code generation unit generates a gray code higher than a predetermined bit among the gray codes corresponding to the predetermined number of bits on the basis of the frequency-divided clock.

<9> There is provided a method for controlling an imaging element including an imaging unit that includes a plurality of pixels and captures an image, a gray code latch that latches a gray code corresponding to a pixel signal of the pixel, a conversion unit that converts the gray code latched in the gray code latch into a binary code, a temporary latch that temporarily latches a predetermined binary code, and a calculation unit that calculates a difference between the binary code converted from the gray code by the conversion unit and the predetermined binary code latched in the temporary latch. The method includes: after the conversion unit converts the gray code into the binary code, allowing the calculation unit to continuously calculate a difference between a binary code corresponding to the same bit converted by the conversion unit and the predetermined binary code latched in the temporary latch.

<10> An imaging apparatus includes: an imaging unit that includes a plurality of pixels and captures an image; gray code latch that latches a gray code corresponding to a pixel signal of the pixel; a conversion unit that converts the gray code latched in the gray code latch into a binary code; a temporary latch that temporarily latches a predetermined binary code; and a calculation unit that calculates a difference between the binary code converted from the gray code by the conversion unit and the predetermined binary code latched in the temporary latch. After the conversion unit converts the gray code into the binary code, the calculation unit continuously calculates a difference between a binary code corresponding to the same bit converted by the conversion unit and the predetermined binary code latched in the temporary latch.

<11> An electronic apparatus includes: an imaging unit that includes a plurality of pixels and captures an image; a gray code latch that latches a gray code corresponding to a pixel signal of the pixel; a conversion unit that converts the gray code latched in the gray code latch into a binary code; a temporary latch that temporarily latches a predetermined binary code; and a calculation unit that calculates a difference between the binary code converted from the gray code by the conversion unit and the predetermined binary code latched in the temporary latch. After the conversion unit converts the gray code into the binary code, the calculation unit continuously calculates a difference between a binary code corresponding to the same bit converted by the conversion unit and the predetermined binary code latched in the temporary latch.

REFERENCE SIGNS LIST

11 Imaging element
31 Pixel array
32 Vertical scanning circuit
33 DAC
34 ADC
35 Horizontal scanning circuit
36 Digital signal calculation circuit
37 Timing control circuit
51, 51-1-1 to 51-$n$-$m$ Pixel
52, 52-1 to 52-$n$ Vertical transmission line
71, 71-1 to 71-$n$ ADC circuit
91, 91-1 to 91-$n$ Comparator
92, 92-1 to 92-$n$ Column counter
121, 121-1 to 121-$n$ GC latch
122, 122-1 to 122-$n$ ALU
123, 123-1 to 123-$n$ Temporary latch
124, 124-1 to 124-$n$ IF latch

The invention claimed is:

1. An imaging element, comprising:
an imaging unit that includes a plurality of pixels and captures an image;
a gray code latch that latches a gray code corresponding to a pixel signal of the plurality of pixels;
a conversion unit that converts the gray code latched in the gray code latch into a binary code;
a temporary latch that temporarily latches a predetermined binary code; and
a calculation unit that calculates a difference between the binary code converted from the gray code by the conversion unit and the predetermined binary code latched in the temporary latch,
wherein, after the conversion unit converts the gray code into the binary code, the calculation unit continuously calculates a difference between a binary code corresponding to a same bit converted by the conversion unit and the predetermined binary code latched in the temporary latch.

2. The imaging element according to claim 1,
wherein the conversion unit calculates the binary code corresponding to a least significant bit first and sequentially converts the gray code corresponding to a high-order bit into the binary code using the binary code corresponding to the least significant bit.

3. The imaging element according to claim 2,
wherein the conversion unit calculates an exclusive OR of all bits latched in the gray code latch as the gray code corresponding to the least significant bit.

4. The imaging element according to claim 1,
wherein the conversion unit converts the gray code latched in the gray code latch into the binary code in units of a plurality of bits, and
after the conversion unit converts the gray code into the binary code, the calculation unit continuously calculates a difference between the binary code corresponding to the same bit converted by the conversion unit and the predetermined binary code latched in the temporary latch in the units of the plurality of bits.

5. The imaging element according to claim 1,
wherein the temporary latch latches a binary code in which all bits are 0 as the predetermined binary code, and
the calculation unit calculates a binary code formed by a difference between the binary code converted from the gray code of a P-phase pixel signal which is the pixel signal in a state in which the plurality of pixels are initialized and the binary code in which all bits are 0 and which is latched in the temporary latch as a binary code of the P-phase pixel signal and latches the calculated binary code in the temporary latch.

6. The imaging element according to claim 5,
wherein the calculation unit outputs a difference between the binary code converted from the gray code of a D-phase pixel signal which is the pixel signal corresponding to an amount of light received by the plurality of pixels and the binary code of the P-phase pixel signal latched in the temporary latch as a binary code of a pixel signal subjected to correlated double sampling (CDS).

7. The imaging element according to claim 1,
wherein the conversion unit converts a complement number of the gray code latched in the gray code latch into a binary code, and
the calculation unit calculates a difference between the binary code which is a conversion result of the conversion unit and the predetermined binary code latched in the temporary latch and outputs a complement number of the difference.

8. The imaging element according to claim 1, further comprising:
a gray code counter that sequentially generates the gray code,
wherein the gray code counter includes:
a low-order gray code generation unit that generates a gray code lower than a predetermined bit among gray codes corresponding to a predetermined number of bits on a basis of a clock signal;
a high-order gray code generation unit that generates a gray code higher than a predetermined bit among the gray codes corresponding to the predetermined number of bits on a basis of the clock signal; and
a frequency-divided clock signal generation unit that generates a frequency-divided clock signal obtained by dividing a frequency of the clock signal by a predetermined number on a basis of a gray code corresponding to the low-order bit, and
the high-order gray code generation unit generates a gray code higher than a predetermined bit among the gray codes corresponding to the predetermined number of bits on a basis of the frequency-divided clock.

9. A method for controlling an imaging element including an imaging unit that includes a plurality of pixels and captures an image, a gray code latch that latches a gray code corresponding to a pixel signal of the plurality of pixels, a conversion unit that converts the gray code latched in the gray code latch into a binary code, a temporary latch that temporarily latches a predetermined binary code, and a calculation unit that calculates a difference between the binary code converted from the gray code by the conversion unit and the predetermined binary code latched in the temporary latch, the method comprising:
after the conversion unit converts the gray code into the binary code, allowing the calculation unit to continuously calculate a difference between a binary code corresponding to a same bit converted by the conversion unit and the predetermined binary code latched in the temporary latch.

10. An imaging apparatus, comprising:
an imaging unit that includes a plurality of pixels and captures an image;
a gray code latch that latches a gray code corresponding to a pixel signal of the plurality of pixels;
a conversion unit that converts the gray code latched in the gray code latch into a binary code;
a temporary latch that temporarily latches a predetermined binary code; and
a calculation unit that calculates a difference between the binary code converted from the gray code by the conversion unit and the predetermined binary code latched in the temporary latch,
wherein, after the conversion unit converts the gray code into the binary code, the calculation unit continuously calculates a difference between a binary code corresponding to a same bit converted by the conversion unit and the predetermined binary code latched in the temporary latch.

11. An electronic apparatus, comprising:
an imaging unit that includes a plurality of pixels and captures an image;
a gray code latch that latches a gray code corresponding to a pixel signal of the plurality of pixels;
a conversion unit that converts the gray code latched in the gray code latch into a binary code;
a temporary latch that temporarily latches a predetermined binary code; and
a calculation unit that calculates a difference between the binary code converted from the gray code by the conversion unit and the predetermined binary code latched in the temporary latch,
wherein, after the conversion unit converts the gray code into the binary code, the calculation unit continuously calculates a difference between a binary code corresponding to a same bit converted by the conversion unit and the predetermined binary code latched in the temporary latch.

* * * * *